United States Patent
Pandev et al.

(10) Patent No.: US 11,880,142 B2
(45) Date of Patent: Jan. 23, 2024

(54) SELF-CALIBRATING OVERLAY METROLOGY

(71) Applicant: KLA Corporation, Milpitas, CA (US)

(72) Inventors: Stilian Pandev, Santa Clara, CA (US); Min-Yeong Moon, Ann Arbor, MI (US); Andrei V. Shchegrov, Campbell, CA (US); Jonathan Madsen, Los Altos, CA (US); Dimitry Sanko, Vallejo, CA (US); Liran Yerushalmi, Zicron Yaacob (IL); Alexander Kuznetsov, Milpitas, CA (US); Mahendra Dubey, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/118,420

(22) Filed: Mar. 7, 2023

(65) Prior Publication Data
US 2023/0221656 A1 Jul. 13, 2023

Related U.S. Application Data

(63) Continuation of application No. 17/488,010, filed on Sep. 28, 2021, now Pat. No. 11,604,420.

(60) Provisional application No. 63/214,573, filed on Jun. 24, 2021, provisional application No. 63/183,075, filed on May 3, 2021.

(51) Int. Cl.
*G03F 7/00* (2006.01)

(52) U.S. Cl.
CPC ...... *G03F 7/70633* (2013.01); *G03F 7/70516* (2013.01); *G03F 7/70775* (2013.01)

(58) Field of Classification Search
CPC ............ G03F 7/70516; G03F 7/70633; G03F 7/70775
USPC ........................................................ 430/22
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |
| 7,478,019 B2 | 1/2009 | Zangooie et al. |
| 7,929,667 B1 | 4/2011 | Zhuang et al. |
| 7,933,026 B2 | 4/2011 | Opsal et al. |
| 9,291,554 B2 | 3/2016 | Kuznetsov et al. |
| 9,885,962 B2 | 2/2018 | Veldman et al. |
| 9,915,522 B1 | 3/2018 | Jiang et al. |
| 10,013,518 B2 | 7/2018 | Bakeman et al. |
| 10,101,670 B2 | 10/2018 | Pandev et al. |
| 10,324,050 B2 | 6/2019 | Hench et al. |
| 10,352,695 B2 | 7/2019 | Dziura et al. |
| 2013/0208279 A1 | 8/2013 | Smith |
| 2014/0172394 A1 | 6/2014 | Kuznetsov et al. |
| 2015/0046121 A1 | 2/2015 | Dziura et al. |
| 2016/0313654 A1 | 10/2016 | Zeng et al. |
| 2018/0106735 A1 | 4/2018 | Gellineau et al. |
| 2019/0017946 A1 | 1/2019 | Wack et al. |
| 2020/0241429 A1 | 7/2020 | Yang et al. |
| 2021/0207956 A1 | 7/2021 | Shchegrov et al. |

FOREIGN PATENT DOCUMENTS

| | | |
|---|---|---|
| WO | 2003071471 A1 | 8/2003 |
| WO | 2021001109 A1 | 1/2021 |

OTHER PUBLICATIONS

International Search Report and Written Opinion in Application No. PCT/US2022/025256 dated Aug. 3, 2022, 7 pages.
Kline et al., "X-ray scattering critical dimensional metrology using a compact x-ray source for next generation semiconductor devices," J. Micro/Nanolith. MEMS MOEMS 16(1), 014001 (Jan.-Mar. 2017).
Lemaillet, P. et al., "Intercomparison between optical and x-ray scatterometry measurements of FinFET structures" Proc. SPIE, v.8681, p. 86810Q (2013).

*Primary Examiner* — Christopher G Young
(74) *Attorney, Agent, or Firm* — Suiter Swantz pc llo

(57) ABSTRACT

A self-calibrating overlay metrology system may receive device overlay data for a device targets on a sample from an overlay metrology tool, determine preliminary device overlay measurements for the device targets including device-scale features using an overlay recipe with the device overlay data as inputs, receive assist overlay data for one or more assist targets on the sample including device-scale features from the overlay metrology tool, where at least one of the one or more assist targets has a programmed overlay offset of a selected value along a particular measurement direction, determine self-calibrating assist overlay measurements for the one or more assist targets based on the assist overlay data, where the self-calibrating assist overlay measurements are linearly proportional to overlay on the sample, and generate corrected overlay measurements for the device targets by adjusting the preliminary device overlay measurements based on the self-calibrating assist overlay measurements.

34 Claims, 17 Drawing Sheets

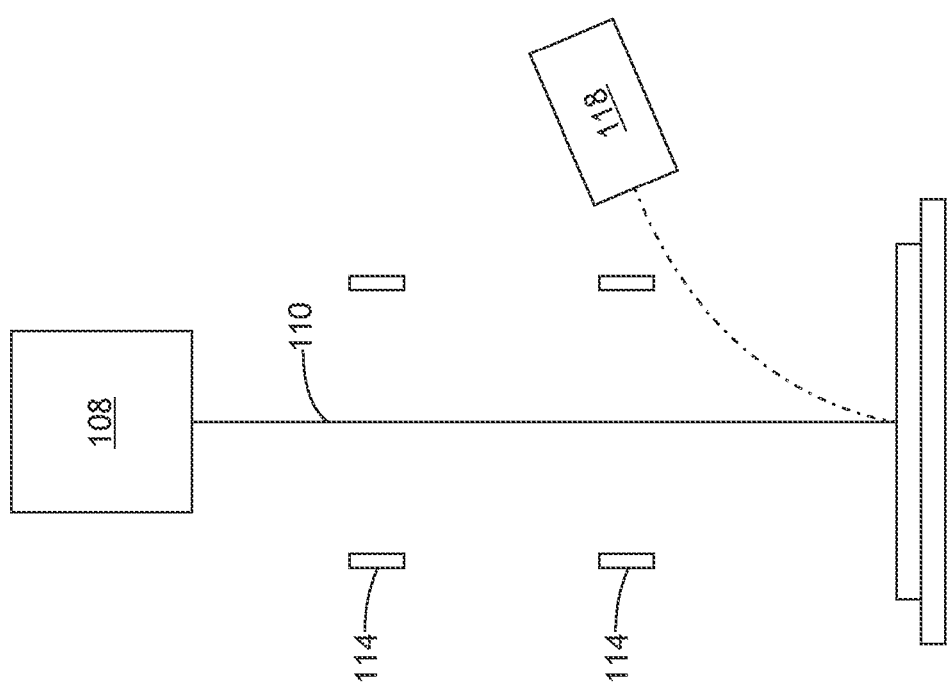

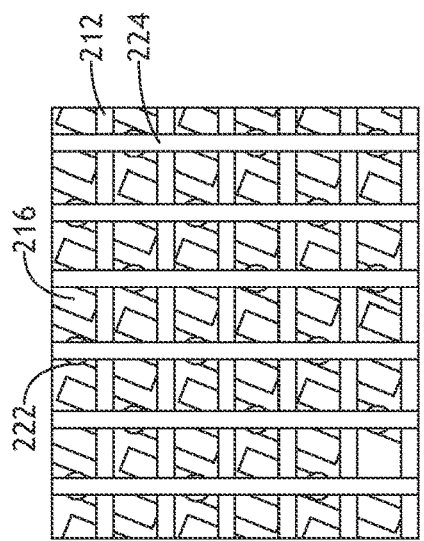
FIG. 2E
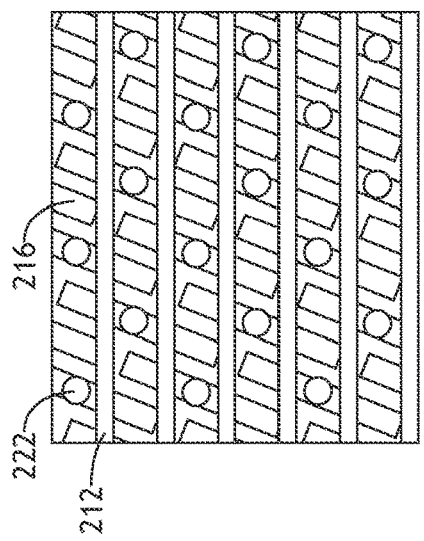
FIG. 2D
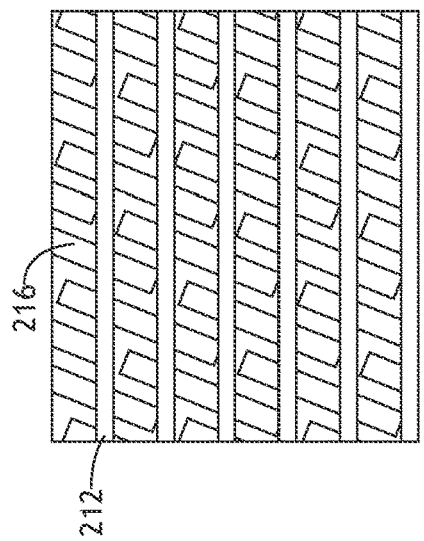
FIG. 2C
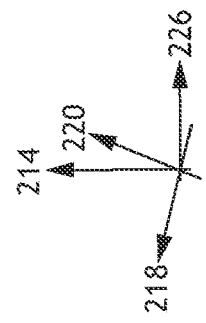

SELF-CALIBRATING OVERLAY METROLOGY

CROSS-REFERENCE TO RELATED APPLICATION

The present application is related to and claims benefit of the earliest available effective filing date from the following applications. The present application is a continuation of U.S. patent application Ser. No. 17/488,010 filed on Sep. 28, 2021, which claims the benefit under 35 U.S.C. § 119(e) of U.S. Provisional Application No. 63/183,075 filed May 3, 2021 and U.S. Provisional Application Ser. No. 63/214,573 filed Jun. 24, 2021, all of which are incorporated herein by reference in the entirety.

TECHNICAL FIELD

The present disclosure relates generally to overlay metrology and, more particularly, to self-calibrated metrology using assist overlay targets.

BACKGROUND

Overlay metrology systems typically characterize the overlay alignment of multiple layers of a sample by measuring the relative positions of overlay target features located on layers of interest. As the size of fabricated features decreases and the feature density increases, the demands on overlay metrology systems needed to characterize these features increase. Various techniques have been developed to measure overlay on a sample, such techniques typically suffer from burdensome complexity, inflexibility, or systematic errors that limit the applicability for demanding applications. There is therefore a need to develop systems and methods to cure the above deficiencies.

SUMMARY

A self-calibrating overlay metrology system is disclosed in accordance with one or more illustrative embodiments of the present disclosure. In one illustrative embodiment, the system includes a controller. In another illustrative embodiment, the controller receives device overlay data for device targets on a sample from an overlay metrology tool. In another illustrative embodiment, the controller determines preliminary device overlay measurements for the device targets including device-scale features using an overlay recipe with the device overlay data as inputs. In another illustrative embodiment, the controller receives assist overlay data for sets of assist targets on the sample including device-scale features from the overlay metrology tool, where a particular set of the assist targets includes one or more target pairs formed with two overlay targets having programmed overlay offsets of a selected value with opposite signs along a particular measurement direction. In another illustrative embodiment, the controller determines self-calibrating assist overlay measurements for the sets of assist targets based on the assist overlay data, where the self-calibrating assist overlay measurements are linearly proportional to overlay on the sample. In another illustrative embodiment, the controller generates corrected overlay measurements for the device targets by adjusting the preliminary device overlay measurements based on the self-calibrating assist overlay measurements.

A self-calibrating overlay metrology system is disclosed in accordance with one or more illustrative embodiments of the present disclosure. In one illustrative embodiment, the system includes two or more overlay metrology tools. In another illustrative embodiment, the system includes a controller. In another illustrative embodiment, the controller receives device overlay data for device targets on a sample from the two or more overlay metrology tools. In another illustrative embodiment, the controller determines preliminary device overlay measurements for the device targets including device-scale features using an overlay recipe with the device overlay data as inputs. In another illustrative embodiment, the controller receives assist overlay data for sets of assist targets on the sample including device-scale features from the two or more overlay metrology tools, and where a particular set of the assist targets includes one or more target pairs formed from two overlay targets having equal programmed overlay offsets of a selected value in opposite directions along a particular measurement direction. In another illustrative embodiment, the controller determines self-calibrating assist overlay measurements for the sets of assist targets based on the assist overlay data, where the self-calibrating assist overlay measurements are linearly proportional to overlay on the sample. In another illustrative embodiment, the controller generates quality metrics for the two or more overlay metrology tools based on differences between the preliminary device overlay measurements and the self-calibrating assist overlay measurements from the two or more overlay metrology tools. In another illustrative embodiment, the controller selects one of the two or more overlay metrology tools based on the quality metrics for the two or more overlay metrology tools. In another illustrative embodiment, the controller generates corrected overlay measurements associated with the selected one of the two or more overlay metrology tools for the device targets by adjusting the preliminary device overlay measurements based on the self-calibrating assist overlay measurements.

A method for self-calibrating overlay metrology is disclosed in accordance with one or more illustrative embodiments of the present disclosure. In one illustrative embodiment, the method includes generating device overlay data for device targets on a sample with one or more overlay metrology tools. In another illustrative embodiment, the method includes determining preliminary device overlay measurements for the device targets including device-scale features using an overlay recipe with the device overlay data as inputs. In another illustrative embodiment, the method includes generating assist overlay data of a set of assist targets on the sample including the device-scale features using the at least one overlay metrology tool, where the set of assist targets includes one or more target pairs formed from two overlay targets having equal programmed overlay offsets of a selected value in opposite directions along a particular measurement direction. In another illustrative embodiment, the method includes determining self-calibrating assist overlay measurements for the set of assist targets based on the assist overlay data. In another illustrative embodiment, the method includes generating corrected overlay measurements associated with each of the one or more overlay metrology tools for the device targets by adjusting the preliminary device overlay measurements based on the self-calibrating assist overlay measurements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1D is a conceptual view of the overlay metrology tool configured as a particle-beam metrology tool, in accordance with one or more embodiments of the present disclosure.

FIG. 2C is a conceptual top view of an overlay target including features on two layers, in accordance with one or more embodiments of the present disclosure.

FIG. 2D is a conceptual top view of the overlay target of FIG. 2C with features on an additional layer, in accordance with one or more embodiments of the present disclosure.

FIG. 2E is a conceptual top view of the overlay target of FIG. 2D with features on an additional layer, in accordance with one or more embodiments of the present disclosure.

DETAILED DESCRIPTION

Figure 1A:
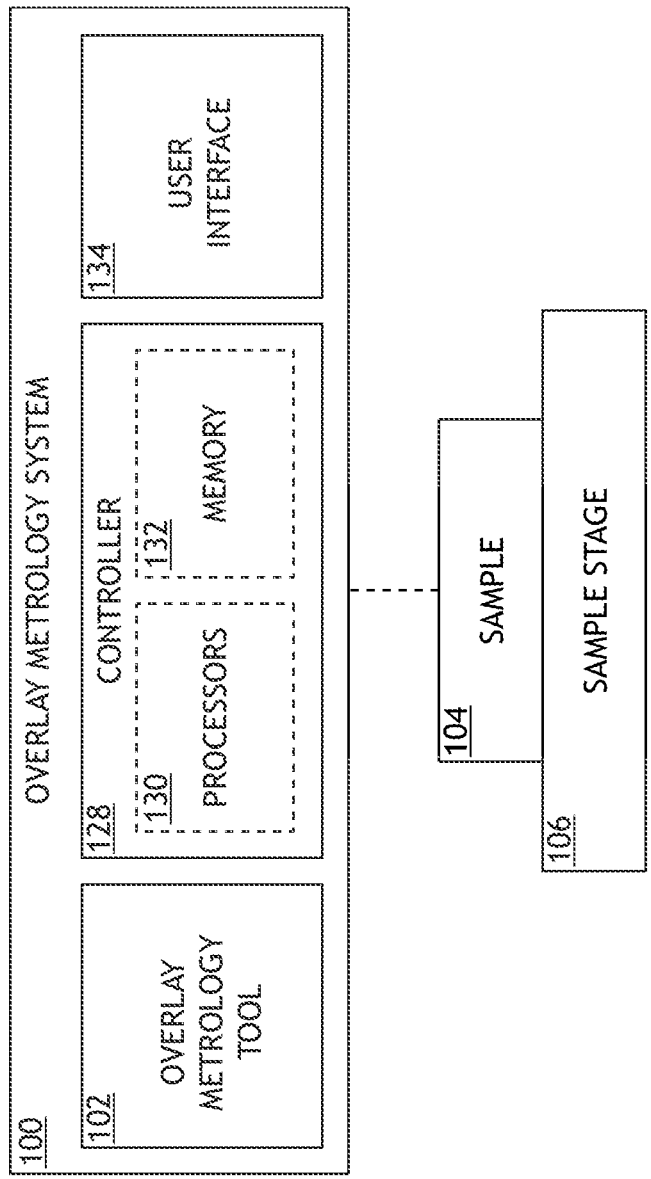
FIG. 1A is a conceptual view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the present disclosure.

Embodiments of the present disclosure are directed to systems and methods for self-calibrating overlay metrology using assist overlay targets.

For the purposes of the present disclosure, the term overlay is used to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Overlay measurements may generally be performed directly on features of a fabricated device (e.g., device features) or on dedicated overlay targets printed using the same lithography steps as the device features. Overlay on device features or in-die device features may beneficially provide measurements on or near the locations of interest on the sample, but may require the use of an overlay recipe involving complex models to relate metrology data to a measurement of physical overlay. Further, the overlay recipe may need to be retrained or adjusted over time to compensate for drifts or deviations of processing equipment or sample variations. In contrast, dedicated overlay targets may generally be placed at any suitable location (e.g., in-die or in scribe lines) and may further include features with characteristics (e.g., size, density, orientation, or the like) specially designed to facilitate overlay measurements. However, a critical challenge to the use of dedicated overlay targets is ensuring that the overlay measurement generated by the dedicated overlay target accurately represents the actual overlay of the device features. A target-based overlay measurement may deviate from an actual overlay of device features for various reasons. For instance, differences in size, orientation, density, or physical location between the target features and the device features may result in fabrication deviations that manifest as systematic errors in the overlay measurement. Additionally, different overlay techniques and target designs may have different tradeoffs between size, accuracy, illumination source requirements and measurement complexity or speed.

Embodiments of the present disclosure are directed to in-die overlay measurements on device targets formed from either device features or device-like features that are calibrated or otherwise corrected through the use of dedicated assist targets. In particular, the assist targets may include sets of assist targets distributed across the sample, where each set includes at least one pair of overlay targets having the same design as the device targets, but also having known programmed overlay offsets of equal magnitude along opposite directions. It is contemplated herein that target signals may be generated for the assist targets that are linearly proportional to the physical overlay on the sample. Additionally, target signals from a set of assist targets with known overlay offsets as disclosed herein may provide a self-calibrating overlay measurement (e.g., an assist overlay measurement).

The target signals may be associated with a variety of overlay measurement techniques such as, but not limited to, Mueller ellipsometry, angular-resolved reflectometry (ARR), small-angle x-ray scatterometry (SAXS), soft x-ray reflectometry, or particle-beam metrology (e.g., electron-beam or SEM metrology). In one embodiment, single-valued target signals for each target (e.g., either a device target or an assist target) are generated based on a combination of data from multiple wavelengths or energy ranges at one or more illumination conditions.

However, it may not be desirable in all applications to utilize assist overlay measurements directly as output measurements of an overlay metrology system. For example, fabricating sets of assist targets with known programmed overlay offsets in a die proximate to device features of interest may undesirably occupy space in the die. By way of another example, fabricating sets of assist targets in scribe lines may suffer from systematic errors associated with increased distance from the device features of interest.

In some embodiments, assist overlay measurements are used to correct, adjust, or otherwise calibrate in-die overlay measurements on the device targets. In particular, it is contemplated herein that although the exact values of overlay measurements for the device targets and the sets of assist targets may not always match even under normal operating conditions (e.g., due to different locations on the sample), various statistical metrics (e.g., means, standard deviations, or the like) associated with these overlay measurements should match under normal operating conditions. Accordingly, statistical metrics associated with overlay measurements of the sets of assist targets may be used to calibrate the overlay measurements of the device targets. In this way, an overlay metrology tool may achieve the advantages of in-die metrology on device targets (e.g., either portions of device features of interest or small device-like targets proximate to the device features of interest) as well as the advantages of self-calibrating measurements from sets of assist overlay targets.

In one embodiment, a sample includes both device targets and sets of assist targets distributed across the sample. Further, the sample may include fewer sets of assist targets than device targets. For instance, the sample may include one set of assist targets and any number of device targets per field on the sample. Self-calibrating overlay metrology may then be performed by generating preliminary overlay measurements for the device targets from overlay data associated with the device targets, generating assist overlay measurements for the sets of assist targets from overlay data associated with the sets of assist targets, and adjusting the preliminary overlay measurements based on the assist overlay measurements to generate corrected overlay measurements for the device targets.

Further, overlay measurements of the device features (e.g., the preliminary overlay measurements) may be generated using a variety of overlay recipes including, but not limited to, an overlay library. For example, an overlay recipe for generating overlay measurements from device features may include, but is not required to include, an overlay library generated by training a machine learning recipe with overlay data of device targets having known physical overlay values and associated overlay data generated by an overlay metrology tool (e.g., a Mueller ellipsometer, ARR, SAXS, SXR, or the like). In this way, a trained machine learning library may provide an overlay measurement of a sample with an unknown overlay value based on overlay data from the overlay tool.

In another embodiment, one or more statistical metrics (e.g., means, standard deviations, or the like) are generated for both the preliminary overlay measurements and the assist overlay measurements. The preliminary overlay measurements may then be adjusted or corrected such that the statistical metrics match those of the assist overlay measurements (e.g., within a selected tolerance). In this way, corrected overlay measurements may include a calibrated version of the preliminary overlay measurements of the device targets. This calibration may be made after collection of overlay data from the sample without the need for any additional measurements.

It is further contemplated herein that the assist overlay measurements and the statistical metrics thereof may be used for a variety of additional purposes. For example, differences between the statistical metrics of the device targets with respect to the sets of assist targets may be used as a means for monitoring the accuracy of an overlay model used to generate the preliminary overlay measurements. For instance, a quality metric may be generated based on differences between the values of the statistical metrics for the preliminary overlay measurements and the assist overlay measurements, which may be used as a trigger for retraining the overlay recipe and/or implementing a new overlay recipe. In one embodiment, the overlay recipe is retrained or otherwise adjusted when the quality metric deviates from a nominal value beyond a selected tolerance. In another embodiment, the overlay recipe may be automatically or continually retrained at selected intervals or times, but only updated when the quality metric deviates from a nominal value beyond a selected tolerance.

Additional embodiments of the present disclosure are directed to measuring tilt error with assist targets. In one embodiment, targets signals are created for a device target and one assist target under conditions (e.g., wavelengths, energies, Mueller components, illumination conditions, or the like) that are separately sensitive to overlay and tilt. In this way, the effects of tilt may be decoupled from overlay.

Additional embodiments of the present disclosure are directed to providing overlay data to one or more process tools. Overlay data from an overlay metrology tool may generally include any output of an overlay metrology tool having sufficient information to determine overlay (or overlay errors) associated with various lithography steps. For example, overlay data may include, but is not required to include, one or more datasets, one or more images, one or more detector readings, or the like. This overlay data may then be used for various purposes including, but not limited to, diagnostic information of the lithography tools or for the generation of process-control correctables. For instance, overlay data for samples in a lot may be used to generate feedback correctables for controlling the lithographic exposure of subsequent samples in the same lot. In another instance, overlay data for samples in a lot may be used to generate feed-forward correctables for controlling lithographic exposures for the same or similar samples in subsequent lithography steps to account for any deviations in the current exposure.

Referring now to FIGS. 1A-7, systems and methods for self-calibrating overlay using assist targets is described in greater detail, in accordance with one or more embodiments of the present disclosure.

FIG. 1A is a conceptual view of an overlay metrology system 100, in accordance with one or more embodiments of the present disclosure.

In one embodiment, the overlay metrology system 100 includes an overlay metrology tool 102 configured to generate overlay data associated with various overlay targets distributed on a sample 104. (e.g., device targets, assist targets, or the like). In another embodiment, the sample 104 is disposed on a sample stage 106. The sample stage 106 may include any device suitable for positioning and/or scanning the sample 104 within the overlay metrology tool 102. For example, the sample stage 106 may include any combination of linear translation stages, rotational stages, tip/tilt stages, or the like. In this way, the sample stage 106 may align a selected overlay target within a measurement field of view of the overlay metrology tool 102 for a measurement.

FIGS. 2A-2E illustrate various overlay targets suitable for use as a device target and/or an assist target. An overlay target may generally include measurable features associated with two or more lithographic exposures located on one or more layers of the sample 104, where the distributions of the features may be suitable for overlay measurements along one or more measurement directions. Further, an overlay target may be characterized after any fabrication step. For example, the overlay metrology tool 102 may generate data for an overlay target after one or more exposure or development steps, one or more etching steps, or one or more cleaning steps. In this way, the overlay metrology tool 102 may provide, but is not limited to, after-development inspection (ADI), after-etch inspection (AEI), after-cleaning inspection (ACI), or any combination thereof.

Figure 2A:
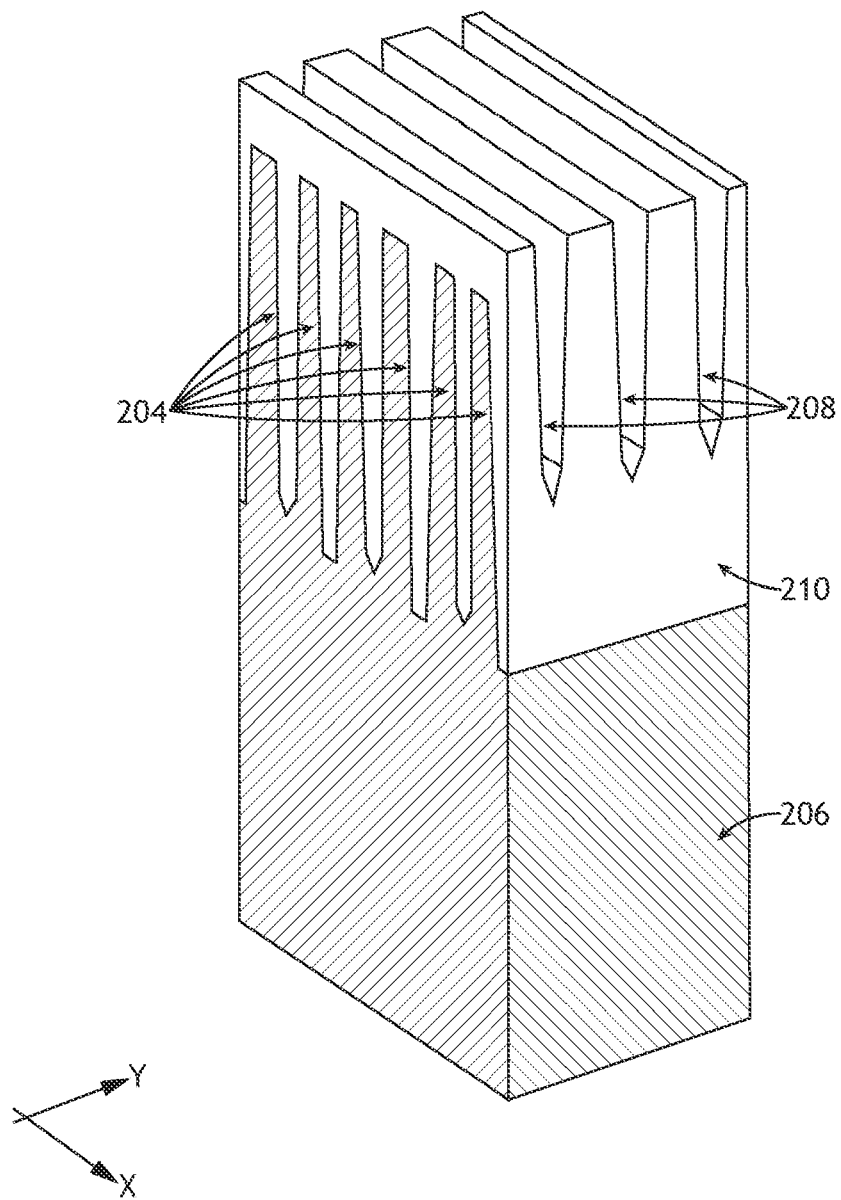
FIG. 2A is a perspective conceptual view of a first illustrative example of an overlay target, in accordance with one or more embodiments of the present disclosure.
Figure 2B:
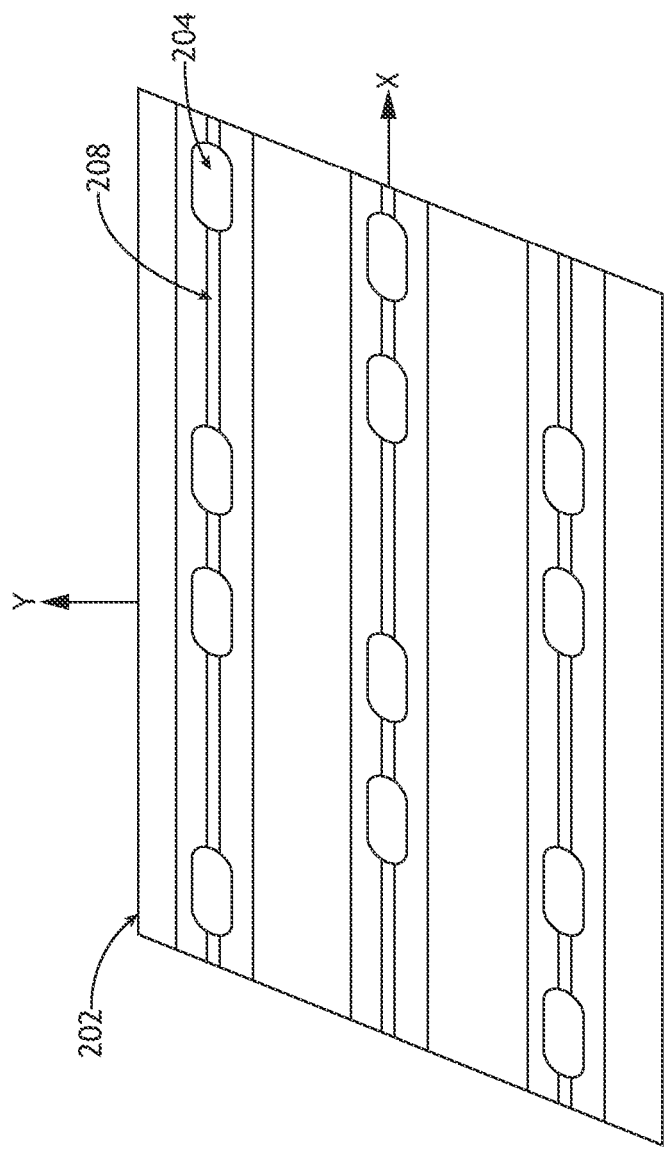
FIG. 2B is a perspective top view of a top surface of the overlay target, in accordance with one or more embodiments of the present disclosure.

FIG. 2A is a perspective conceptual view of a first illustrative example of an overlay target 202, in accordance with one or more embodiments of the present disclosure. FIG. 2B is a perspective top view of a top surface of the overlay target 202, in accordance with one or more embodiments of the present disclosure. In particular, the overlay target 202 in FIGS. 2A and 2B includes a first set of features 204 (e.g., raised fins) of a first material 206 having structural elements along a first direction (e.g., an X direction) and a second set of features 208 of a second material 210 having structural elements (e.g., grooves) along a second direction (e.g., a Y direction). Further, portions of the first set of features 204 are visible through various grooves of the second set of features 208 to provide a selected pattern of the first set of features 204 in each of the grooves of the second set of features 208.

FIGS. 2C-2E provide additional illustrative examples of an overlay target 202 and further illustrate how a target may be generated through sequential patterning by multiple process steps to create a stacked overlay target 202. FIG. 2C is a conceptual top view of an overlay target 202 including features on two layers, in accordance with one or more embodiments of the present disclosure. In particular, FIG. 2C illustrates a first set of features 212 on a first layer formed as a periodic series of bar structures having a periodicity along a first direction 214 and a second set of features 216 formed as a 2D pattern of bar structures periodically spaced along a second direction 218 and a third direction 220, where the second direction 218 and the third direction 220 are at a diagonal with respect to the first direction 214 (e.g., are neither parallel nor perpendicular to the first direction 214). In this way, overlay of the first set of features 212 with respect to the second set of features 216 along at least the first direction 214 may be measured. FIG. 2D is a conceptual top view of the overlay target 202 of FIG. 2C with features on an additional layer, in accordance with one or more embodiments of the present disclosure. In particular, FIG. 2D illustrates a third set of features 222 formed as circular or pillar features distributed with a 2D pattern with respect to the first set of features 212 and the second set of features 216. For example, the third set of features 222 nominally overlap with the second set of features 216 at locations between the first set of features 212. In this way, overlay of the third set of features 222 with respect to either the first set of features 212 or the second set of features 216 may be measured. FIG. 2E is a conceptual top view of the overlay target 202 of FIG. 2D with features on an additional layer, in accordance with one or more embodiments of the present disclosure. In particular, FIG. 2E illustrates a fourth set of features 224 formed as a periodic series of bar structures along a fourth direction 226 that is perpendicular to the first direction 214 distributed with a 2D pattern with respect to the first set of features 212 and the second set of features 216. Additionally, the fourth set of features 224 nominally overlap with the third set of features 222. In this way, overlay of the fourth set of features 224 with respect to either the second set of features 216 or third set of features 222 may be measured.

Referring now generally to FIGS. 2A-2E, any of the variations of the overlay target 202 may be used as the basis for a device target or an assist target. As described previously herein, a device target may generally include either device features of interest (or a portion thereof) or a dedicated target with device-like features (e.g., features having similar dimensions, density, or orientation as device features of interest) located proximate to the device features of interest. For example, dedicated device targets may be, but are not required to be, in the same die as features of interest. Further, an assist target may have the same or a similar design as the device targets on the sample 104 and may thus include device-like features (e.g., features having similar dimensions, density, or orientation as device features of interest). In this way, the printing characteristics of the assist targets may be similar to the printing characteristics of the devices and device targets that they are intended to represent. However, the assist targets may differ from the device targets in that each includes a programmed (e.g., intended) overlay offset in at least one direction (e.g., corresponding to a measurement direction). For example, a programmed overlay offset in the overlay target 202 illustrated in FIGS. 2A and 2B may correspond to a lateral shift of a pattern of the first direction 214 along the first direction 214. By way of another example, a programmed overlay offset in the overlay target 202 illustrated in FIG. 2E may correspond to a lateral shift of the 2D pattern of the second set of features 216 or the third set of features 222 with respect to any of the other structures in any relevant direction. Further, as will be described in greater detail herein, the assist targets may be arranged in pairs, where assist targets in a particular pair have programmed offsets associated with particular structures of equal magnitude but opposite direction.

Additionally, it is contemplated herein that stacked targets such as, but not limited to, those illustrated in FIGS. 2C-2E may facilitate robust overlay measurements and robust training of overlay recipes as will be described in greater detail herein. For example, assist targets may be formed with various combinations of programmed overlays between various features in various layers which may be used to generate a comprehensive training set for training an overlay recipe. Further, non-intended variations of the fabricated structures associated with physical overlay errors induced during fabrication for any of the assist target designs may also be used to provide further training data for robust overlay recipe generation.

It is to be understood that the depictions of an overlay target 202 in FIGS. 2A-2E are provided solely for illustrative purposes and should not be interpreted as limiting. Rather, a multitude of designs of an overlay target 202 are within the spirit and scope of the present disclosure. In this way, the systems and methods disclosed herein may provide self-calibrated overlay measurements for a wide range of applications.

Figure 1B:
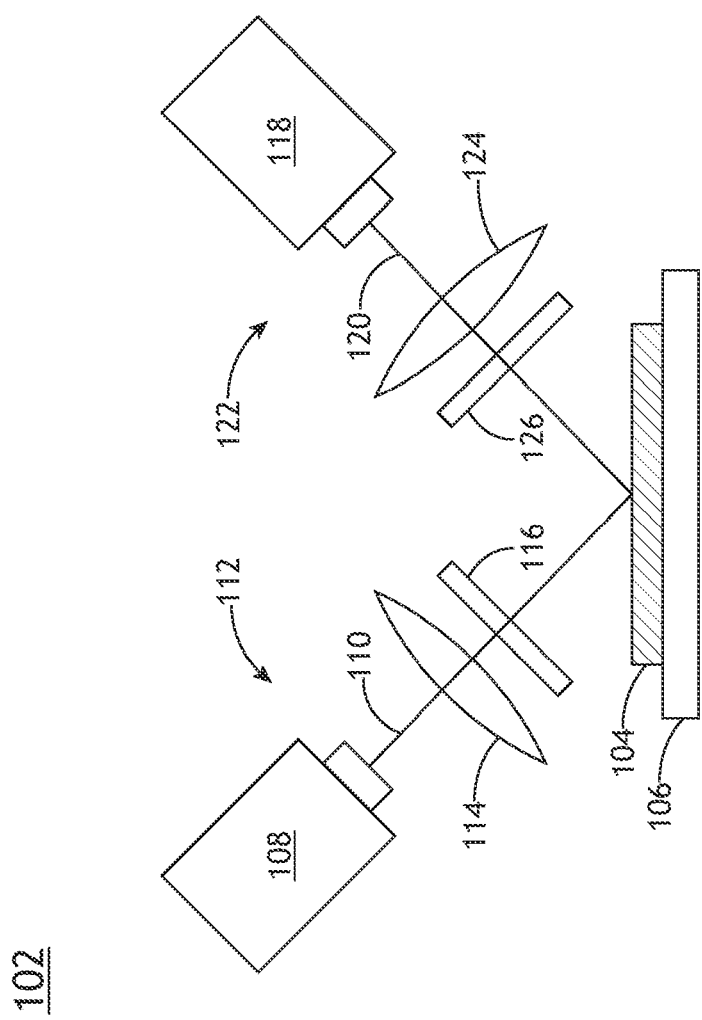
FIG. 1B is a conceptual view of an overlay metrology tool suitable for optical measurements, in accordance with one or more embodiments of the present disclosure.
Figure 1C:
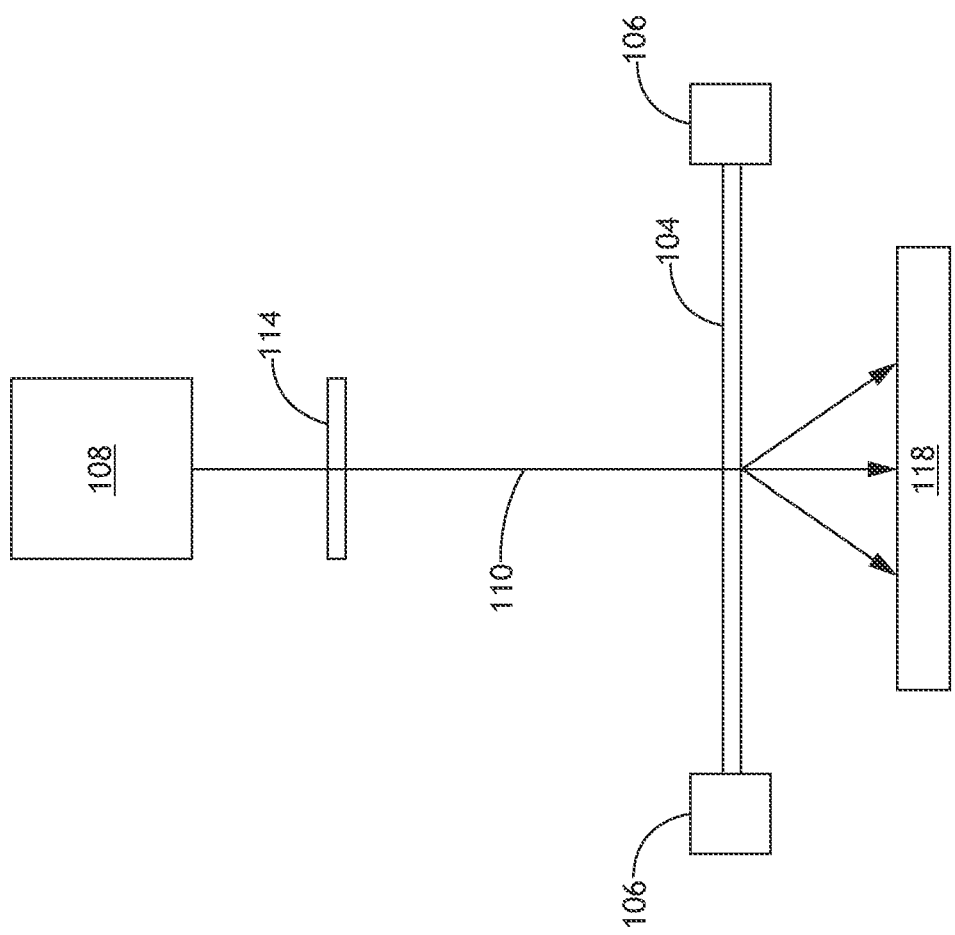
FIG. 1C is a conceptual view of the overlay metrology tool configured as an x-ray tool, in accordance with one or more embodiments of the present disclosure.

Referring now to FIGS. 1B-1D, various configurations of the overlay metrology tool 102 are described in greater detail, in accordance with one or more embodiments of the present disclosure.

In a general sense, an overlay metrology tool 102 may illuminate the sample 104 with at least one illumination beam and collect at least one measurement signal from the sample 104 in response to the illumination beam. The illumination beam may include, but is not limited to, an optical beam (e.g., a light beam) at any wavelength or range of wavelengths, an x-ray beam, an electron beam, or an ion beam. In this way, the overlay metrology tool 102 may operate as an optical metrology tool, an x-ray metrology tool, an electron-beam (e.g., e-beam) metrology tool, or an ion beam metrology tool.

FIG. 1B is a conceptual view of an overlay metrology tool 102 suitable for optical measurements, in accordance with one or more embodiments of the present disclosure. For example, FIG. 1B may generally illustrate various configurations including, but not limited to, a spectroscopic ellipsometer (SE), an SE with multiple angles of illumination, an SE measuring Mueller matrix elements (e.g. using rotating compensator(s)), a single-wavelength ellipsometer, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, an imaging system, or a scatterometer (e.g., speckle analyzer). The wavelengths for optical systems can vary from about 120 nm to 3 microns. For non-ellipsometer systems, signals collected can be polarization-resolved or unpolarized.

In one embodiment, the overlay metrology tool 102 includes an illumination source 108 to generate an optical illumination beam 110. The illumination beam 110 may include one or more selected wavelengths of light including, but not limited to, ultraviolet (UV) radiation, visible radiation, or infrared (IR) radiation.

The illumination source 108 may be any type of illumination source known in the art suitable for generating an optical illumination beam 110. In one embodiment, the illumination source 108 includes a broadband plasma (BBP) illumination source. In this regard, the illumination beam 110 may include radiation emitted by a plasma. For example, a BBP illumination source 108 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 110.

In another embodiment, the illumination source 108 may include one or more lasers. For instance, the illumination source 108 may include any laser system known in the art capable of emitting radiation in the infrared, visible, or ultraviolet portions of the electromagnetic spectrum.

The illumination source 108 may further produce an illumination beam 110 having any temporal profile. For example, the illumination source 108 may produce a continuous illumination beam 110, a pulsed illumination beam 110, or a modulated illumination beam 110. Additionally, the illumination beam 110 may be delivered from the illumination source 108 via free-space propagation or guided light (e.g., an optical fiber, a light pipe, or the like).

In another embodiment, the illumination source 108 directs the illumination beam 110 to the sample 104 via an illumination pathway 112. The illumination pathway 112 may include one or more illumination pathway lenses 114 or additional optical components 116 suitable for modifying and/or conditioning the illumination beam 110. For example, the one or more optical components 116 may include, but are not limited to, one or more polarizers, one or more filters, one or more beam splitters, one or more diffusers, one or more homogenizers, one or more apodizers, or one or more beam shapers.

In another embodiment, the overlay metrology tool 102 includes a detector 118 configured to capture photon or particle emissions from the sample 104 (e.g., a collection signal 120) through a collection pathway 122. The collection pathway 122 may include, but is not limited to, one or more collection pathway lenses 124 for directing at least a portion of the collection signal 120 to a detector 118. For example, a detector 118 may receive collected, reflected or scattered light (e.g., via specular reflection, diffuse reflection, and the like) from the sample 104 via one or more collection pathway lenses 124. By way of another example, a detector 118 may receive one or more diffracted orders of radiation from the sample 104 (e.g., 0-order diffraction, ±1 order diffraction, ±2 order diffraction, and the like). By way of another example, a detector 118 may receive radiation generated by the sample 104 (e.g., luminescence associated with absorption of the illumination beam 110, or the like).

The detector 118 may include any type of detector known in the art suitable for measuring illumination received from the sample 104. For example, a detector 118 may include, but is not limited to, a charge-coupled device (CCD) detector, a time delay integration (TDI) detector, a photomultiplier tube (PMT), an avalanche photodiode (APD), or the like. In another embodiment, a detector 118 may include a spectroscopic detector suitable for identifying wavelengths of light emanating from the sample 104.

The collection pathway 122 may further include any number of collection pathway lenses 124 or collection optical elements 126 to direct and/or modify collected illumination from the sample 104 including, but not limited to, one or more filters, one or more polarizers, one or more apodizers, or one or more beam blocks.

FIG. 1C is a conceptual view of the overlay metrology tool 102 configured as an x-ray tool, in accordance with one or more embodiments of the present disclosure. The overlay metrology tool 102 may include any type of x-ray tool known in the art providing an x-ray illumination beam 110 and capturing an associated collection signal 120, which may include, but is not limited to, x-ray emissions, optical emissions, or particle emissions. Examples of x-ray configurations include, but are not limited to, a small-angle x-ray scatterometer (SAXR), or a soft x-ray reflectometer (SXR).

For example, the overlay metrology tool 102 may include a SAXR tool. SAXS is a scatterometry technology using hard x-rays (e.g., greater than 15 keV). SAXS is generally described in the following publications, all of which are incorporated herein by reference in their entireties: U.S. Pat. Nos. 7,929,667; 10,013,518; 9,885,962; 10,324,050; 10,352,695; U.S. Patent Publication No. 20180106735; "Intercomparison between optical and x-ray scatterometry measurements of FinFET structures" by Lemaillet, Germer, Kline et al., Proc. SPIE, v.8681, p. 86810Q (2013); and "X-ray scattering critical dimensional metrology using a compact x-ray source for next generation semiconductor devices," J. Micro/Nanolith. MEMS MOEMS 16(1), 014001 (January-March 2017).

By way of another example, the overlay metrology tool 102 may include an SXR tool. SXR is a scatterometry technology that uses soft X-ray energy photons (<3 keV). SXR is generally described in U.S. Patent Publication No. 20190017946 and U.S. patent application Ser. No. 17/137,840, both of which are incorporated herein by reference in their entirety.

In one embodiment, the overlay metrology tool 102 includes x-ray illumination pathway lenses 114 suitable for collimating or focusing an x-ray illumination beam 110 and collection pathway lenses 124 (not shown) suitable for collecting, collimating, and/or focusing x-rays from the sample 104. For example, the overlay metrology tool 102 may include, but is not limited to, x-ray collimating mirrors, specular x-ray optics such as grazing incidence ellipsoidal mirrors, polycapillary optics such as hollow capillary x-ray waveguides, multilayer optics, or systems, or any combination thereof. In another embodiment, the overlay metrology tool 102 includes an x-ray detector 118 such as, but not limited to, an x-ray monochromator (e.g., a crystal monochromator such as a Loxley-Tanner-Bowen monochromator, or the like) x-ray apertures, x-ray beam stops, or diffractive optics such as zone plates.

FIG. 1D is a conceptual view of the overlay metrology tool 102 configured as a particle-beam metrology tool (e.g., an e-beam metrology tool), in accordance with one or more embodiments of the present disclosure.

In one embodiment, the overlay metrology tool 102 includes one or more particle focusing elements (e.g., illumination pathway lenses 114, collection pathway lenses 124 (not shown), or the like). For example, the one or more particle focusing elements may include, but are not limited to, a single particle focusing element or one or more particle focusing elements forming a compound system. Further, the one or more particle focusing elements may include any type of electron lenses known in the art including, but not limited to, electrostatic, magnetic, uni-potential, or double-potential lenses. It is noted herein that the description of a voltage contrast imaging inspection system as depicted in FIG. 1C and the associated descriptions above are provided solely for illustrative purposes and should not be interpreted as limiting. For example, the overlay metrology tool 102 may include any excitation source known in the art suitable for generating inspection data on a sample 104. In another embodiment, the overlay metrology tool 102 includes two or more particle beam sources (e.g., electron beam sources or ion beam sources) for the generation of two or more particle beams. In a further embodiment, the overlay metrology tool 102 includes one or more components (e.g., one or more electrodes) configured to apply one or more voltages to one or more locations of the sample 104. In this regard, the overlay metrology tool 102 may generate voltage contrast imaging data.

In another embodiment, the overlay metrology tool 102 includes one or more particle detectors 118 to image or otherwise detect particles emanating from the sample 104. In one embodiment, a detector 118 includes an electron collector (e.g., a secondary electron collector, a backscattered electron detector, or the like). In another embodiment, a detector 118 includes a photon detector (e.g., a photodetector, an x-ray detector, a scintillating element coupled to a photomultiplier tube (PMT) detector, or the like) for detecting electrons and/or photons from the sample surface.

Referring now generally to FIGS. 1A-1D, various hardware configurations may be separated into discrete operational systems or integrated within a single tool. For example, metrology with a combination of multiple hardware configurations in a single tool generally described in U.S. Pat. No. 7,933,026 which is hereby incorporated by reference in its entirety. By way of another example, metrology with multiple metrology tools is generally described in U.S. Pat. No. 7,478,019, which is incorporated herein by reference in its entirety. By way of another example, various hardware configurations are generally described in U.S. Pat. Nos. 5,608,526, 5,859,424, and 6,429,943, all of which are incorporated herein by reference in their entirety.

The overlay metrology tool 102 may further be configured in various hardware configurations to measure various structure and/or material characteristics of one or more layers of the sample 104 in addition to overlay such as, but not limited to, critical dimensions (CDs) of one or more structures, film thicknesses, or film compositions after one or more fabrication steps.

Referring again to FIG. 1A, additional components of the overlay metrology system 100 are described in greater detail, in accordance with one or more embodiments of the present disclosure.

In another embodiment, the overlay metrology system 100 includes a controller 128 communicatively coupled to the overlay metrology tool 102 and/or any components therein. In another embodiment, the controller 128 includes one or more processors 130. For example, the one or more processors 130 may be configured to execute a set of program instructions maintained in a memory device 132, or memory. The one or more processors 130 of a controller 128 may include any processing element known in the art. In this sense, the one or more processors 130 may include any microprocessor-type device configured to execute algorithms and/or instructions.

The one or more processors 130 of a controller 128 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FP-GAs), or one or more digital signal processors (DSPs)). In this sense, the one or more processors 130 may include any device configured to execute algorithms and/or instructions (e.g., program instructions stored in memory). In one embodiment, the one or more processors 130 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 128 may include one or more controllers housed in a common housing or within multiple housings. In this way, any controller or combination of controllers may be separately packaged as a module suitable for integration into overlay metrology system 100.

The memory device 132 may include any storage medium known in the art suitable for storing program instructions executable by the associated one or more processors 130. For example, the memory device 132 may include a non-transitory memory medium. By way of another example, the memory device 132 may include, but is not limited to, a read-only memory (ROM), a random-access memory (RAM), a magnetic or optical memory device (e.g., disk), a magnetic tape, a solid-state drive and the like. It is further noted that the memory device 132 may be housed in a common controller housing with the one or more processors 130. In one embodiment, the memory device 132 may be located remotely with respect to the physical location of the one or more processors 130 and the controller 128. For instance, the one or more processors 130 of the controller 128 may access a remote memory (e.g., server), accessible through a network (e.g., internet, intranet and the like).

The controller 128 may direct (e.g., through control signals) or receive data from the overlay metrology tool 102 or any components therein. The controller 128 may further be configured to perform any of the various process steps described throughout the present disclosure such as, but not limited to, generating preliminary overlay measurements based on overlay data associated with device targets from the overlay metrology tool 102, generating assist overlay measurements based on overlay data associated with sets of assist targets from the overlay metrology tool 102, generating statistical metrics associated with the preliminary overlay data and the assist overlay data, comparing the statistical metrics associated with the preliminary overlay data and the assist overlay data, adjusting the preliminary overlay data based on the assist overlay data to generate corrected overlay measurements, generating one or more quality metrics based on differences between the statistical metrics of the preliminary overlay data with respect to the assist overlay data, process control monitoring based on the statistical metrics associated with the preliminary overlay data and the assist overlay data, or training (or retraining) an overlay recipe based on corrected overlay measurements.

In one embodiment, the memory device 132 includes a data server. For example, the data server may collect data from the overlay metrology tool 102 or other external tools associated with the device targets and/or assist targets at any processing step or steps (e.g., ADI steps, AEI steps, ACI steps, or the like). Further, the data server may store overlay measurements from the device features both before and after correction based on the assist overlay measurements. The data server may also store training data associated with training or otherwise generating an overlay recipe. The controller 128 may then utilize any such data to create, update, retrain, or modify overlay recipes (e.g., machine learning overlay recipes) used to generate overlay measurements using overlay data from the device targets.

In another embodiment, the overlay metrology system 100 includes a user interface 134 communicatively coupled to the controller 128. In one embodiment, the user interface 134 may include, but is not limited to, one or more desktops, laptops, tablets, and the like. In another embodiment, the user interface 134 includes a display used to display data of the overlay metrology system 100 to a user. The display of the user interface 134 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 134 is suitable for implementation in the present disclosure. In another embodiment, a user may input selections and/or instructions responsive to data displayed to the user via a user input device of the user interface 134.

Referring now to FIG. 3-7, various method steps for self-calibrating overlay measurements are described in greater detail, in accordance with one or more embodiments of the present disclosure. Applicant notes that the embodiments and enabling technologies described previously herein in the context of the overlay metrology system 100 should be interpreted to extend to the steps below. It is further noted, however, that the steps below are not limited to the architecture of the overlay metrology system 100.

Figure 3:
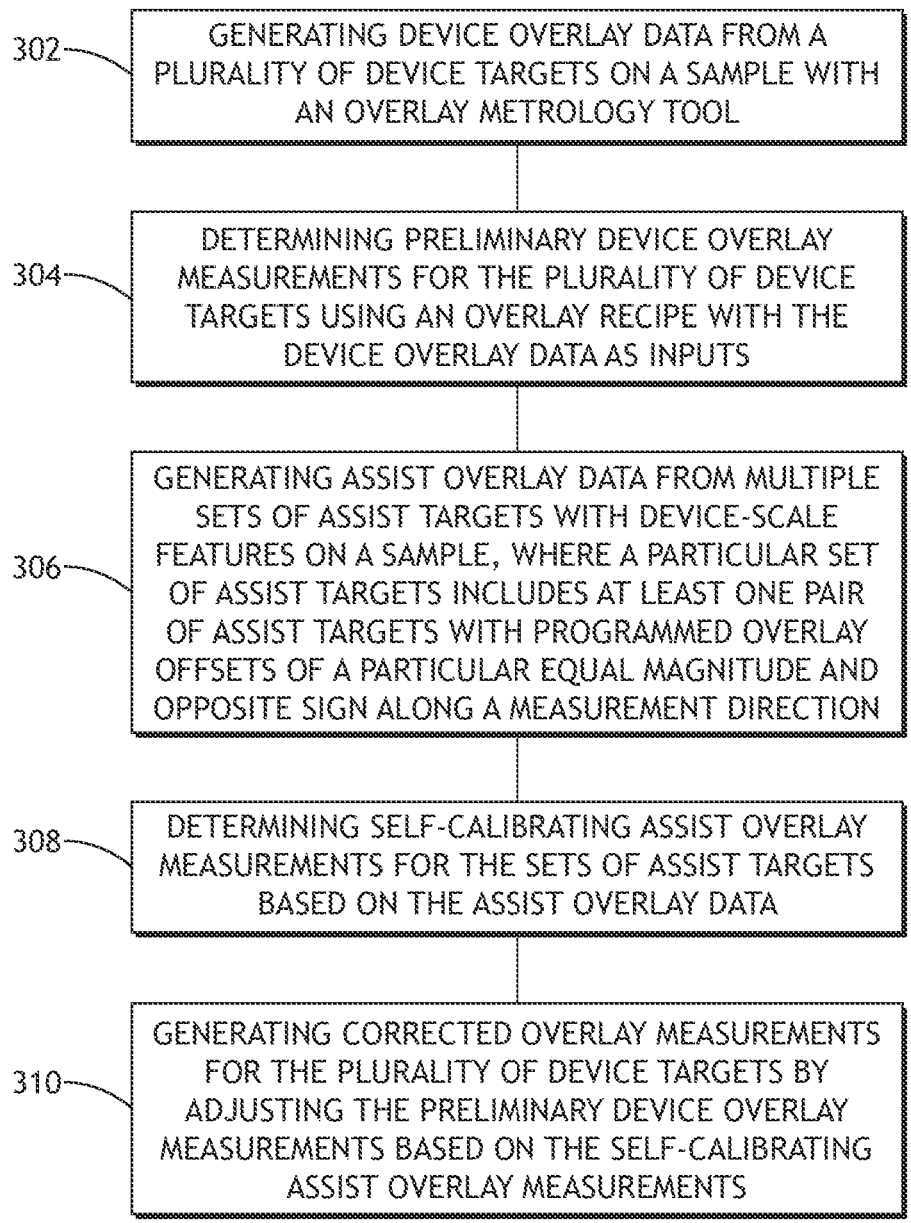
FIG. 3 is a flow diagram illustrating steps performed in a method for self-calibrating overlay, in accordance with one or more embodiments of the present disclosure.

FIG. 3 is a flow diagram illustrating steps performed in a method 300 for self-calibrating overlay, in accordance with one or more embodiments of the present disclosure.

In one embodiment, the method 300 includes a step 302 of generating device overlay data from a plurality of device targets on a sample (e.g., the sample 104) with an overlay metrology tool such as, but not limited to, the overlay metrology tool 102. In another embodiment, the method 300 includes a step 304 of determining preliminary device overlay measurements for the plurality of device targets using an overlay recipe with the device overlay data as inputs.

The device targets may include any combination of structures suitable for providing an indication of overlay when analyzed with an overlay metrology tool 102. For example, the device targets may include device features, or portions thereof, associated with functional components of a device to be fabricated. In this way, overlay may be measured directly on structures of interest. By way of another example, the device targets may include dedicated overlay targets having device-like features. Such targets may be, but are not required to be, located in a die of the sample 104. In this way, the dedicated overlay targets may be proximate to the structures of interest.

The device overlay data generated in step 302 may include any type of device overlay data generated by any type of overlay metrology tool. Similarly, the preliminary device overlay measurements generated in step 304 may utilize any suitable overlay recipe to provide overlay measurements based on the device overlay data as inputs.

For example, the device overlay data may be analyzed by a number of data fitting and optimization techniques such as, but not limited to, machine-learning algorithms (e.g., machine learning libraries, linear machine learning models, neural networks, convolutional networks, support-vector machines (SVM), or the like), dimensionality-reduction algorithms (e.g., PCA (principal component analysis), ICA (independent component analysis), LLE (local-linear embedding), or the like), fast-reduced-order models, regression, sparse representation (e.g., Fourier transform techniques, wavelet transform techniques, or the like), Kalman filters, or algorithms to promote matching from same or different tool types. Further, statistical model-based metrology is generally described in U.S. Pat. No. 10,101,670, which is incorporated herein by reference in its entirety. By way of another example, the device overlay data may be analyzed by algorithms that do not include modeling, optimization and/or fitting such as patterned wafer characterization is generally described in U.S. Patent Publication No. 2015/0046121, which is incorporated herein by reference in its entirety.

By way of another example, the overlay recipe may include modeling or simulation of the optical interaction of the illumination beam 110 with the sample 104 using various techniques including, but not limited to, rigorous coupled-wave analysis (RCWA), finite element method (FEM) analysis, method of moments techniques, surface integral techniques, volume integral techniques, or finite-difference time-domain (FDTD) techniques. Further, the device targets may be, but are not required to be, modeled or parametrized using a geometric engine, a process modeling engine or a combination thereof. The use of process modeling is generally described in U.S. Patent Publication No. 2014/0172394, which is incorporated herein by reference in its entirety. A geometric engine is implemented, for example, in AcuShape, a software product of KLA Corporation. However, it is contemplated herein that one benefit of self-calibrated overlay as disclosed herein is that accurate parameterization of sample structures is not required.

By way of another example, the overlay recipe may include measuring the composition of one or more layers of the semiconductor stack, measuring certain defects on (or within) the sample 104 and/or measuring the amount of photolithographic radiation exposed to the sample 104. Further, the overlay recipe may be configured for any type of target design such as, but not limited to, periodic or non-periodic targets. Metrology of non-periodic targets is generally described in U.S. Pat. Nos. 9,915,522 and 9,291,554, both of which are incorporated herein by reference in their entirety.

In one embodiment, the method 300 includes a step 306 of generating assist overlay data from multiple sets of assist targets with device-scale features on a sample, where a particular set of assist targets includes at least one pair of assist targets with programmed overlay offsets of a particular equal magnitude and opposite sign along a measurement direction. In another embodiment, the method 300 includes a step 308 of determining self-calibrating assist overlay measurements for the sets of assist targets based on the assist overlay data.

As described previously herein, an assist target may include an overlay target (e.g., see FIGS. 2A-2E) having a programmed overlay offset for at least one set of features along a particular direction (e.g., a measurement direction). Further, assist targets may be provided in pairs having programmed offsets of equal magnitude but opposite direction. It is contemplated herein that a set of assist targets including at least one pair of assist targets with programmed offsets along a particular measurement direction may provide self-calibrating assist overlay measurements along the particular measurement direction. In particular, the self-calibrating assist overlay measurements may be linearly proportional to physical overlay such that physical overlay errors induced during fabrication within a selected operational range induce linear changes in the self-calibrating assist overlay measurements, which may be characterized by a slope.

It is further contemplated herein that self-calibrating assist overlay measurements that are linearly proportional to physical overlay may be generated in a variety of ways using a variety of pairs of assist targets within each set and/or with a variety of types of assist overlay data.

In one embodiment, the step 306 includes generating two asymmetric target signals based on assist overlay data, where a particular asymmetric target signal is generated with at least one of assist overlay data of a common assist target under different measurement conditions (e.g., different azimuth angles, or the like) or assist data from different assist targets in a pair. The term asymmetric target signal is used herein to refer to a signal providing an asymmetric variation to physical overlay deviations from a nominal overlay condition. In this way, physical overlay deviations or errors along opposite directions may be distinguished. For example, an asymmetric target signal may be, but is not required to be, a linear function of physical overlay within a selected operational range. The step 306 may then include generating the self-calibrating assist overlay measurements based on a combination of the two asymmetric target signals. For example, the self-calibrating assist overlay measurements are related to the two asymmetric target signals through a linear system of equations.

Referring now to FIGS. 4A-4G, two non-limiting approaches for generating assist overlay data from multiple sets of assist targets with device-scale features on a sample (e.g., step 306) are described, in accordance with one or more embodiments of the present disclosure. FIGS. 4A-4G are generated based on measurements with an overlay metrology tool 102 configured as a Mueller ellipsometer such that the assist overlay data includes measurements across a selected wavelength range at one or more selected measurement angles (e.g., incidence angles of an illumination beam 110), and associated with one or more Mueller elements. It is to be understood, however, that FIGS. 4A-4G are provided solely for illustrative purposes and should not be interpreted as limiting. Rather, various approaches using different sets of assist targets, measurement conditions, and/or configurations of an overlay metrology tool 102 are possible based on the concepts disclosed herein.

In one embodiment, a set of assist targets includes two pairs of assist targets (e.g., a first pair of assist targets and a second pair of assist targets) with different magnitudes of a programmed offset along a common measurement direction. In this configuration, two asymmetric signals may be generated based on difference signals associated with selected assist overlay data from each pair of assist targets.

Figure 4A:
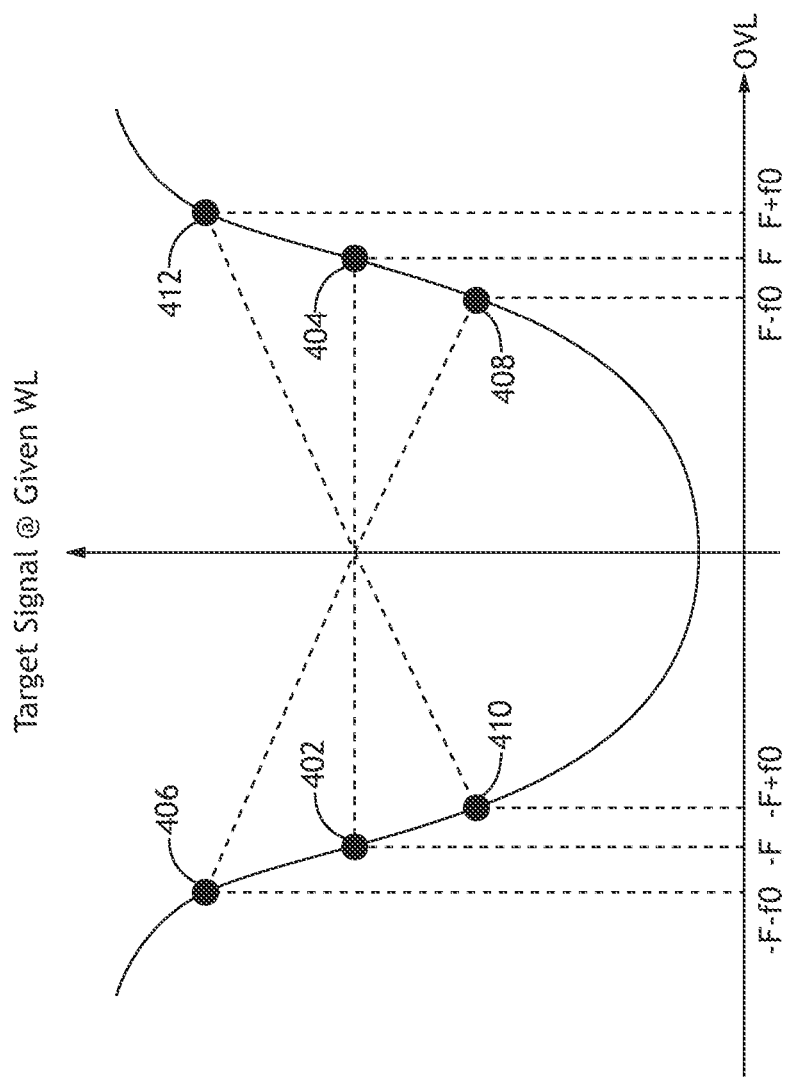
FIG. 4A is a conceptual plot illustrating a target signal associated with a particular design of an assist target with varying programmed offsets, in accordance with one or more embodiments of the present disclosure.

FIG. 4A is a conceptual plot illustrating a target signal associated with a particular design of an assist target with varying programmed offsets, in accordance with one or more embodiments of the present disclosure. For example, the target signal may correspond to a value of the assist overlay data for the assist target generated by a Mueller ellipsometer at a specific wavelength or a mathematical combination (e.g., a sum, a square root of a sum, a principal component analysis, or the like) of assist overlay data over a range of wavelengths or other measurement conditions, where the target signal is sensitive to variations in overlay. As illustrated in FIG. 4A, in cases where an assist target is symmetric at a nominal overlay condition (e.g., zero overlay), a target signal may also be symmetric over a range of overlay values such that the direction of overlay may not be distinguished. In some cases, such as in a case where the assist target is periodic, the target signal will also be periodic. For example, point 402 is associated with an overlay value of −F and point 404 is associated with an overlay value of +F. In this case, the value of the target signal is the same at both points and the direction of overlay (e.g., the sign of the overlay) is not distinguishable.

However, as also illustrated in FIG. 4A, target signals associated with non-equal overlay values may not be equal and may provide data indicative of overlay. For example, an asymmetric signal (S1) may be generated based on a difference between the target signal from a first assist target with a programmed overlay offset of −F−f0 (e.g., point 406) and the target signal associated with a second assist target with a programmed offset of F−f0 (e.g., point 408). In the context of FIG. 4A, this represents two assist targets with programmed offsets selected to be offset in a common direction from a nominal value (F) by a selected amount (−f0). As an illustration considering arbitrary values of F=2.5 and f0=0.5, the asymmetric signal may be generated based on a difference between target signals from a first assist target with a programmed offset of −F−f0=−3 and a second assist target with a programmed offset of F−f0=2.

Such an asymmetric signal (e.g., S1) may be linearly proportional to the physical overlay, but will have a value that is offset from the true physical overlay. For example, the signal S1 will have a non-zero value when the physical overlay on the sample is zero. It is contemplated herein that a self-calibrated assist overlay measurement that is both linear with respect to physical overlay changes and zero when the physical overlay is zero may be obtained using two asymmetric signals (e.g., difference signals in this configuration). For example, a second asymmetric signal (S2) may be generated with assist targets having programmed offsets of −F+f0 (e.g., point 410) and F+F0 (e.g., point 412), which corresponds to programmed offsets selected to be offset in a common direction from a nominal value (F) by a selected amount (f0) but in the opposite direction as for the first asymmetric signal. Continuing the illustration above, this second asymmetric signal (S2) may be generated based on a difference between target signals from a third assist target with a programmed offset of −F+f0=−2 and a fourth assist target with a programmed offset of F+f0=3. The first, second, third, and fourth assist targets thus form two pairs of assist targets, each having programmed overlay offsets of equal magnitudes but opposite sign, all along a common measurement direction. For example, a first pair of assist targets has programmed overlay offset values of −3 and +3, and a second pair of assist targets has programmed overlay offset values of −2 and +2.

Figure 4B:
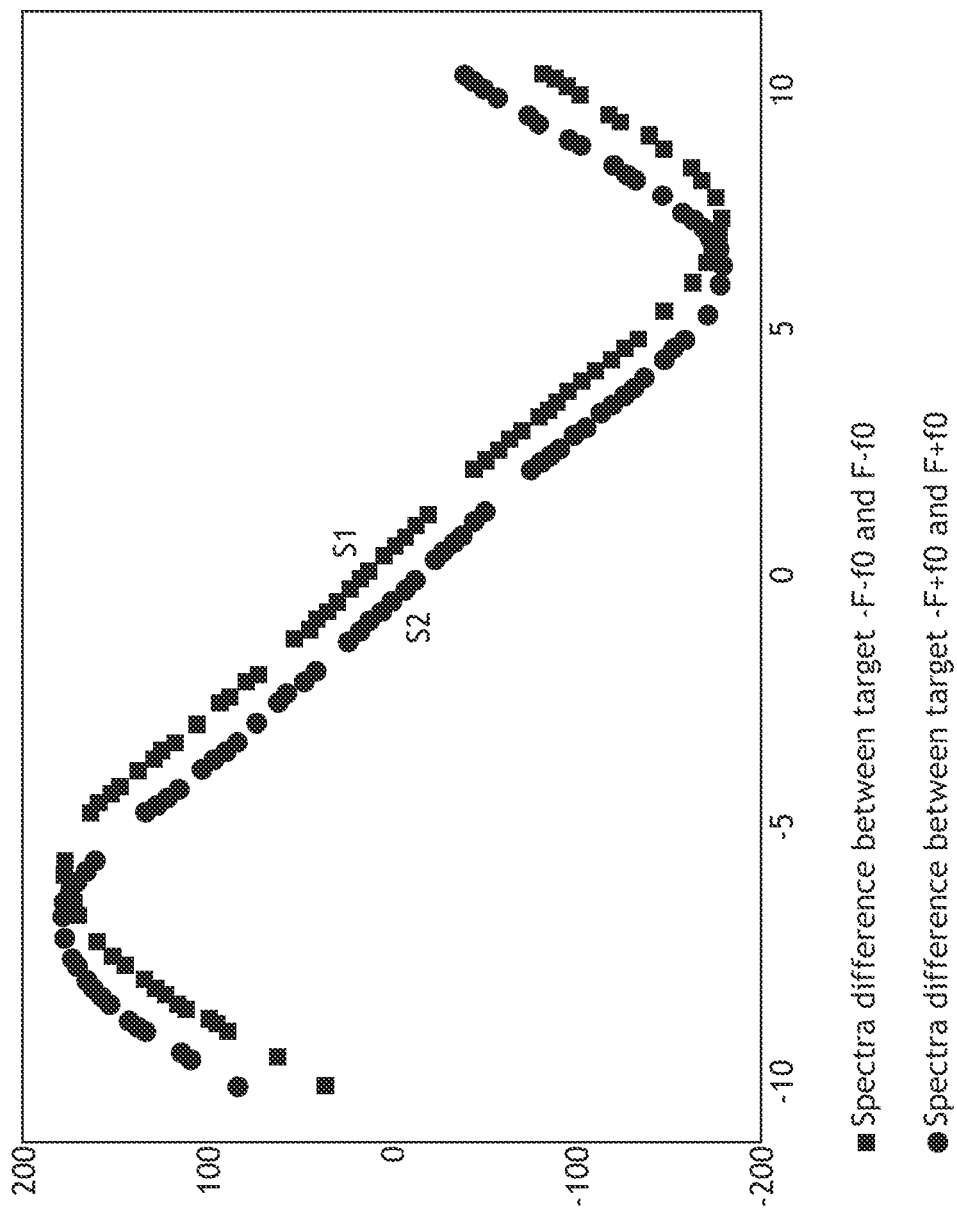
FIG. 4B is a plot of two asymmetric signals associated with a set of two pairs of assist targets, each having programmed overlay offsets of equal magnitudes but opposite sign, in accordance with one or more embodiments of the present disclosure.

FIG. 4B is a plot of two asymmetric signals (S1 and S2) associated with a set of two pairs of assist targets, each having programmed overlay offsets of equal magnitudes but opposite sign, in accordance with one or more embodiments of the present disclosure. As illustrated in FIG. 4B, when the physical overlay on a sample 104 is zero, value of S1=−S2. As the physical overlay changes, the values of S1 and S2 change linearly with the same slope. Further, a self-calibrating assist overlay measurement ($OVL_{Self-cal}$) associated with the set assist targets may be characterized as:

$$OVL_{Self-cal} = f_0 \left( \frac{S1 + S2}{S1 - S2} \right). \tag{1}$$

Figure 4C:
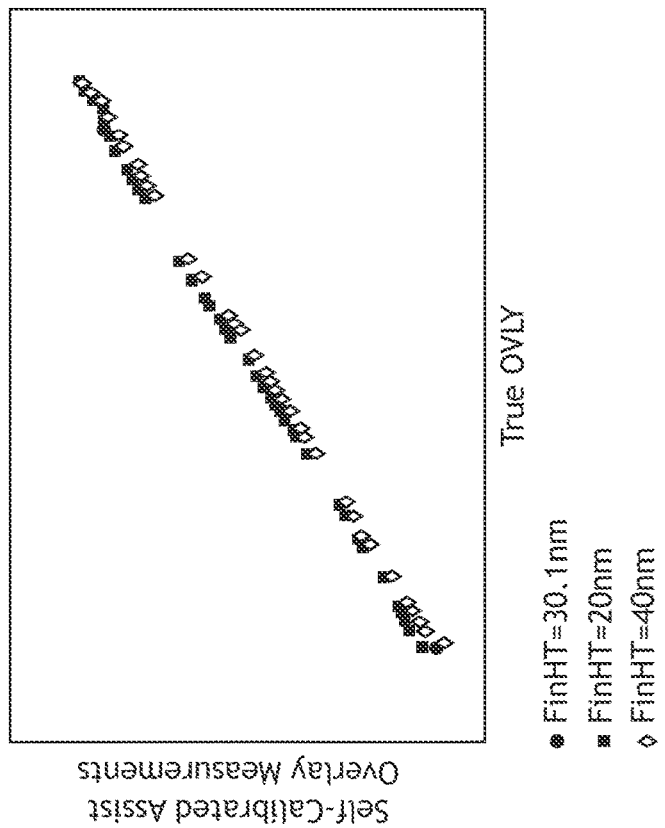
FIG. 4C is a plot of a target signal generated with a set of assist targets having the design illustrated in FIGS. 2A and 2B as a function of true overlay, in accordance with one or more embodiments of the present disclosure.
Figure 4D:
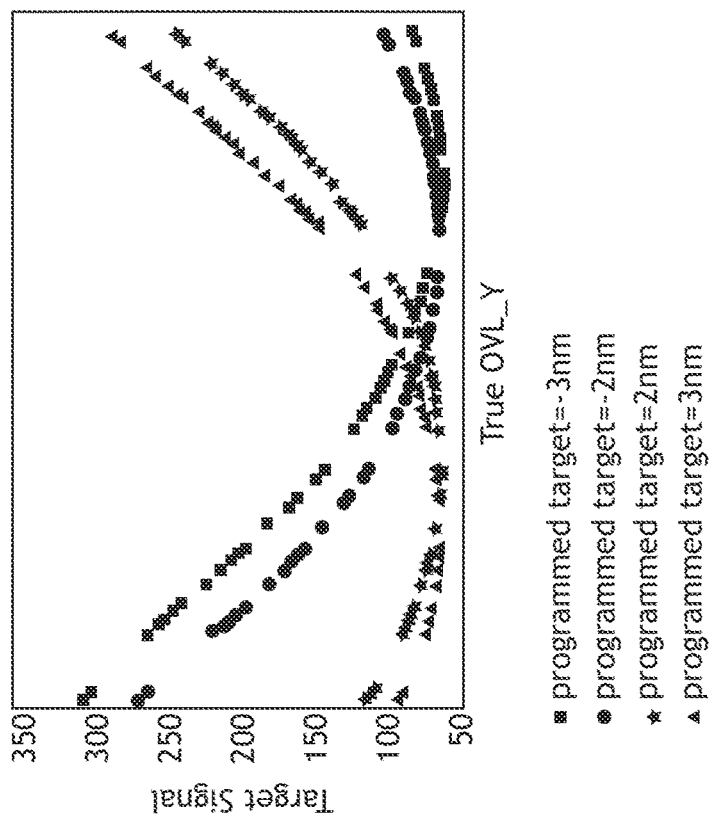
FIG. 4D is a plot of a self-calibrating assist overlay measurement generated based on the set of assist targets of FIG. 4C, in accordance with one or more embodiments of the present disclosure.

FIG. 4C is a plot of a target signal generated with a set of assist targets having the design illustrated in FIGS. 2A and 2B, where the set of assist targets includes two pairs of assist targets with programmed overlay offsets of +/−3 nm and +/−2 nm as a function of true overlay (e.g., physical overlay), in accordance with one or more embodiments of the present disclosure. FIG. 4D is a plot of a self-calibrating assist overlay measurement ($OVL_{Self-cal}$) generated based on the set of assist targets of FIG. 4C, in accordance with one or more embodiments of the present disclosure. Further, FIG. 4D illustrates the self-calibrating assist overlay measurement ($OVL_{Self-cal}$) for various targets having different heights of the first set of features 204 (e.g., FinHT), illustrating the insensitivity to underlying feature parameters other than the overlay.

The target signal associated with each of the assist targets in FIG. 4C in the set corresponds to a version of the conceptual illustration in FIG. 4A by the programmed offset amount. Further, as illustrated in FIG. 4D, the self-calibrating assist overlay measurement ($OVL_{Self-cal}$) associated with the set of assist targets is linearly proportional to physical overlay and has a value of zero when the physical overlay is zero.

In FIG. 4B, asymmetric signals (S1 and S2) were generated based on assist targets having different programmed overlay offsets to break the symmetry of the target signal with respect to a nominal (e.g., zero) overlay condition. It is contemplated herein that generating asymmetric signals using any techniques for breaking the symmetry of a target signal is within the spirit and scope of the present disclosure.

Figure 4F:
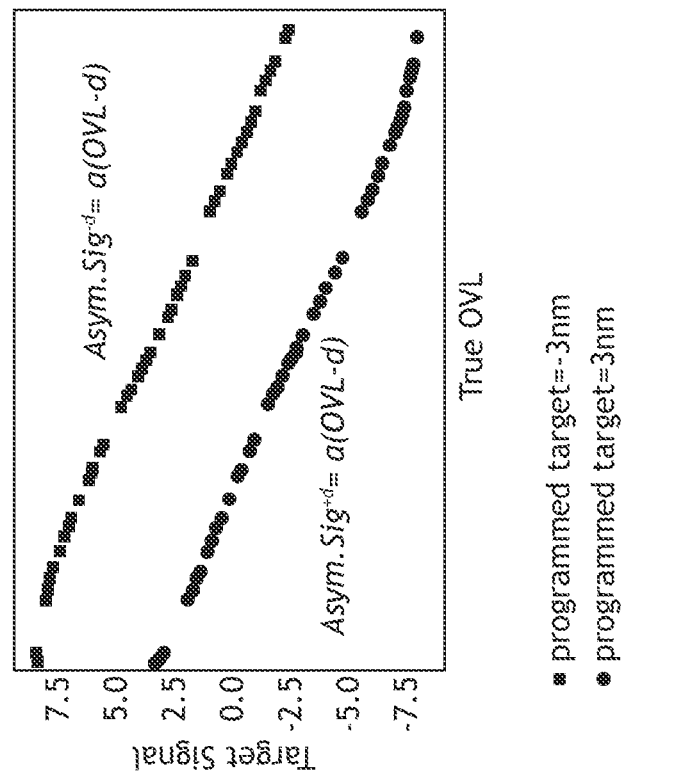
FIG. 4F is a plot of two asymmetric signals associated with a single pair of assist targets with programmed overlay offsets of equal magnitudes but opposite sign that are generated based on differences between target signals associated with different azimuth measurement angles, in accordance with one or more embodiments of the present disclosure.
Figure 4E:
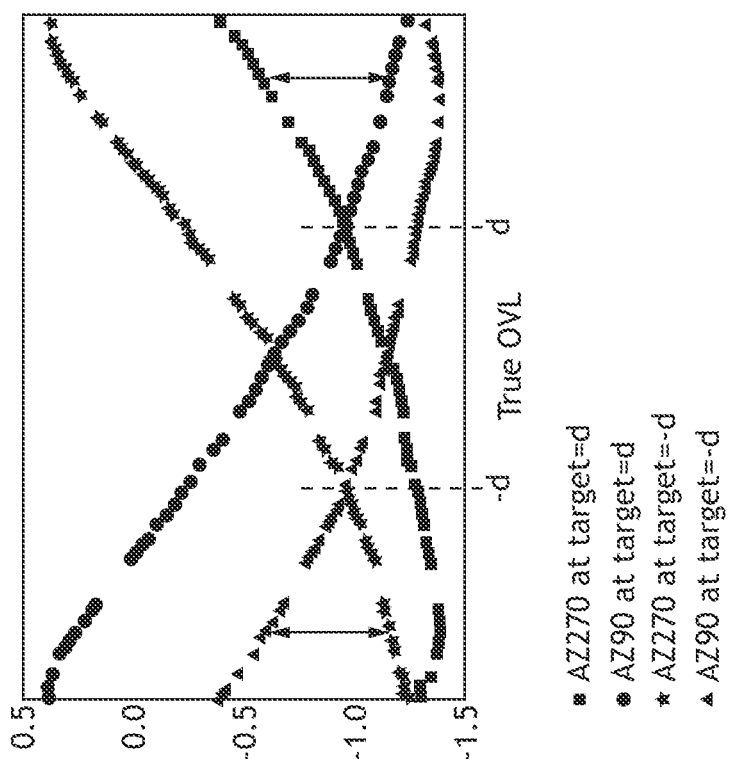
FIG. 4E is a plot of target signals generated on a pair of assist targets with programmed overlay offsets of +/− d, where d is a constant, at opposing azimuth angles along the measurement direction, in accordance with one or more embodiments of the present disclosure.
Figure 4G:
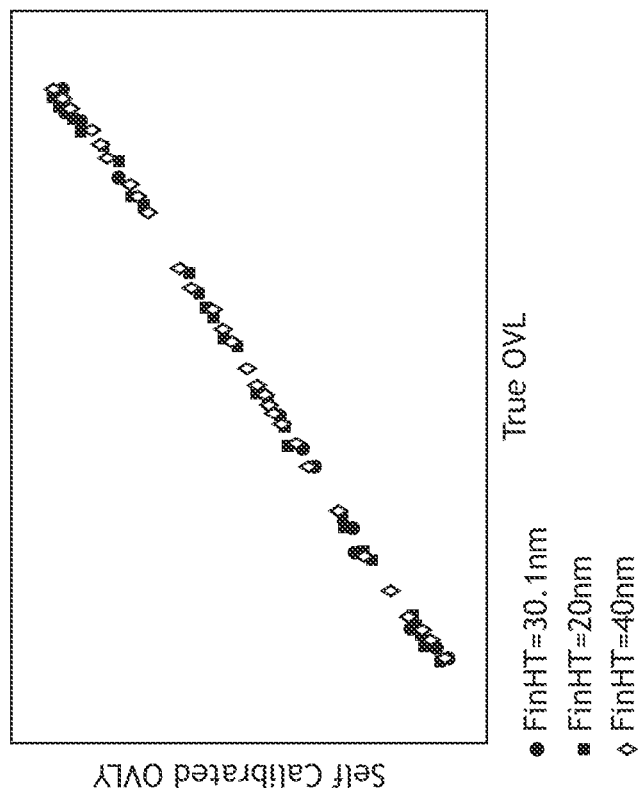
FIG. 4G is a plot of a self-calibrating assist overlay measurement generated based on the single pair of assist targets of FIG. 4D, in accordance with one or more embodiments of the present disclosure.

Referring now to FIGS. 4E-4G, in some embodiments, self-calibrating assist overlay measurements are generated based on asymmetric signals associated with assist overlay data from a single pair of assist targets with programmed overlay offsets having equal magnitude and opposite sign, where the assist data is generated using multiple measurement conditions.

In one embodiment, assist overlay data is generated for a pair of assist targets with opposing illumination conditions (e.g., opposing azimuth angles of an illumination beam 110). In this way, asymmetric signals may be differences between target signals generated with the different measurement conditions.

FIG. 4E is a plot of target signals generated on a pair of assist targets with programmed overlay offsets of +/− d, where d is a constant, at opposing azimuth angles (e.g., 90 and 270 degrees) along the measurement direction, in accordance with one or more embodiments of the present disclosure. As illustrated in FIG. 4E, the targets signals associated with each measurement sent corresponds to a shifted version of the conceptual illustration in FIG. 4A. Further, a difference between target signals of a particular assist target generated with the opposing azimuth measurement angles is linearly proportional to physical overlay variations and may thus be used as an asymmetric signal.

FIG. 4F is a plot of two asymmetric signals (Asym.Sig$^{-d}$ and Asym.Sig$^{+d}$) associated with a single pair of assist targets with programmed overlay offsets of equal magnitudes but opposite sign that are generated based on differences between target signals associated with different azimuth measurement angles, in accordance with one or more embodiments of the present disclosure. FIG. 4F illustrates the self-calibrating assist overlay measurement ($OVL_{Self-cal}$) for various targets having different heights of the first set of features 204 (e.g., FinHT), illustrating the insensitivity to underlying feature parameters other than the overlay.

Each of the asymmetric signals is linearly proportional to the physical overlay (e.g., true overlay) across an operational range around a nominal overlay value (e.g., zero overlay). Further, the two asymmetric signals generated in this way may have the same slope, but have nonzero values when the physical overlay is zero. For example, the two asymmetric signals may be represented as Asym.Sig$^{-d}$=a($OVL_{true}$−d) and Asym.Sig$^{+d}$=a(OVL+d), where d is the programmed offset, OVL is the true or physical overlay, and a is a constant. In this way, the asymmetric signals generated with the single pair of assist targets is similar to the asymmetric signals generated with two pairs of assist targets as illustrated in FIG. 4B-4D.

A self-calibrating assist overlay measurement ($OVL_{Self-cal}$)$_1$ associated with the single pair of assist targets may then be characterized as:

$$OVL_{Self-cal} = d\left(\frac{Asym \cdot Sig^{+d} + Asym \cdot Sig^{-d}}{Asym \cdot Sig^{+d} - Asym \cdot Sig^{-d}}\right). \quad (2)$$

FIG. 4G is a plot of a self-calibrating assist overlay measurement ($OVL_{Self-cal}$) generated based on the single pair of assist targets of FIG. 4D, in accordance with one or more embodiments of the present disclosure. As illustrated in FIG. 4G, the self-calibrating assist overlay measurement ($OVL_{Self-cal}$) associated with the set of assist targets is linearly proportional to physical overlay and has a value of zero when the physical overlay is zero.

Referring now generally to FIGS. 4A-4G, it is to be understood that the examples herein are provided solely for illustrative purposes and should not be interpreted as limiting. For example, although FIGS. 4A-4G describe the formation of single-valued target signals for each target as the basis of the asymmetric signals, this is not a requirement. In some embodiments, single-valued asymmetric signals are formed as a mathematical combination of data associated with multi-valued target signal data. For instance, although the asymmetric signal S1 is described as a difference between a single-valued target signal for an assist target with a programmed offset of −F−f0 and a single-valued target signal for an assist target with a programmed offset of F−f0, the asymmetric signal S1 may be formed by taking a difference between measurement spectra associated with the two targets (e.g., subtracting the measurement spectra) and then generating a single-valued signal based on this difference. Similar techniques may be utilized for asymmetric signals Asym.Sig$^{-d}$ and Asym.Sig$^{+d}$.

Further, a single-valued target signal and/or a single-valued asymmetric signal may be generated in a variety of ways. For example, a single-valued target signal and/or a single-valued asymmetric signal may be generated by selecting a single measurement condition that is sensitive to overlay (e.g., a single wavelength and Mueller element in the case of a Mueller ellipsometer, or the like). By way of another example, a single-valued target signal and/or a single valued asymmetric signal may be generated by performing a mathematical operation on a range of data generated by the overlay metrology tool 102 (e.g., a range of wavelengths and/or a combination of Mueller elements in the case of a Mueller ellipsometer). Further, any mathematical operation suitable for generating a single value from a range of data such as, but not limited to, a sum, a square-root of a sum, or a principal component analysis.

Additionally, as previously described herein, the overlay metrology tool 102 may generally include any tool suitable for generating data that is sensitive to variations in overlay such as, but not limited to, an optical tool, an x-ray tool, a particle-based tool (e.g., e-beam, ion beam, or the like). In this way, a target signal and/or an asymmetric signal as described with respect to FIGS. 4A-4G may include any type of signal that is sensitive to variations of overlay in a selected design of an overlay target (e.g., design target and assist targets with programmed overlay offsets). For example, an asymmetric signal associated with an overlay metrology tool 102 configured as an SAXS may be formed in various ways such as, but not limited to, a difference between measurements of different diffraction orders on an assist target, or a difference between measurements at different angles of incidence of an illumination beam 110 (e.g., polar angles of incidence and/or azimuth angles of incidence). By way of another example, an asymmetric signal associated with an overlay metrology tool 102 configured as an SXR may be formed in various ways such as, but not limited to, a difference between measurements of different diffraction orders on an assist target, or a difference between measurements at different azimuth angles of incidence of an illumination beam 110. By way of another example, an asymmetric signal associated with an overlay metrology tool 102 configured as an ARR may be formed in various ways such as, but not limited to, a difference between pupil image measurements at different azimuth angles or wavelengths.

In some embodiments, the method 300 includes determining measurement conditions (e.g., a wavelength of an illumination beam 110, an energy of an illumination beam 110, an incidence angle of an illumination beam 110, a polarization of an illumination beam 110, a collection angle, a collection polarization, or the like) for generating a target signal of an assist target that is sensitive to overlay. For example, the method may include collecting measurements from an overlay metrology tool 102 at multiple measurement conditions, analyzing the measurements based on a sensitivity to overlay, and selecting one or more measurement conditions providing data that is sensitive to overlay. Further, in the case that multiple measurement conditions are selected, the method may additionally include selecting an operator to provide a single-valued target signal and/or a single-valued asymmetric signal based on the collected data.

In some embodiments, assist targets as disclosed herein are used to independently measure or otherwise decouple overlay and tilt of the sample 104.

In one embodiment, a set of assist targets may be used to provide separate measurements of overlay and tilt. For example, as described above with respect to determining measurement conditions suitable for overlay measurements, it may be the case that a first set of measurement conditions provide data (e.g., a target signal) that is sensitive to overlay but insensitive to tilt and a second set of measurement conditions provide data (e.g., a target signal) that is sensitive to tilt but insensitive to overlay. In this case, the first set of measurement conditions may be used to provide self-calibrated assist overlay measurements as described above and the second set of measurement conditions may be used to provide self-calibrated tilt measurements using the same techniques as for the self-calibrated assist overlay measurements (e.g., generating a self-calibrated tilt signal that is linearly proportional to tilt on the sample 104).

In another embodiment, the tilt error is decoupled from an overlay measurement using a variation of the technique described with respect to FIGS. 4E-4G, where measurements for one of the assist targets is replaced with measurements of a device target. For example, in the case where an assist overlay target with a programmed offset of d and a device target are used, Equation (2) may be modified to the following:

$$OVL = d\left(\frac{Asym \cdot Sig^{+d} + Asym \cdot Sig^{dev}}{Asym \cdot Sig^{+d} - Asym \cdot Sig^{dev}}\right) \quad (3)$$

where $Asym.Sig^{dev}$ corresponds to an asymmetric signal generated from the device overlay data of the device target. Further, in this configuration, the measurement conditions may be selected to provide sensitivity to overlay and insensitivity to tilt. The tilt of the sample 104 may then be approximated as a fixed quantity in neighboring targets. For example, one technique for decoupling tilt and overlay is to select a wavelength region that is sensitive to overlay but not sensitive to tilt when calculating asymmetric signals associated with a programmed offset d. In this case, tilt can be approximated as fixed constant in neighboring targets because the tilt variation is negligible.

Referring again to FIG. 3, in another embodiment, the method 300 includes a step 310 of generating corrected overlay measurements for the plurality of device targets by adjusting the preliminary device overlay measurements based on the self-calibrating assist overlay measurements.

It is contemplated herein that the accuracy, precision, stability, and/or other performance metrics of an overlay recipe used to generate the preliminary device overlay data (e.g., in step 304) may vary or degrade over time and it is further contemplated herein that the self-calibrating assist overlay metrology data may be used to adjust the preliminary device overlay data to compensate for such variations of the performance of the overlay recipe.

In one embodiment, the step 310 of generating corrected overlay measurements for the plurality of device targets includes calculating one or more statistical metrics (e.g., within-waver for the preliminary device overlay measurements and for the self-calibrating assist overlay measurements. Although the assist targets (or the sets thereof) are located in different locations than the device targets and such that the associated self-calibrating assist overlay measurements may exhibit associated systematic errors, it is further contemplated herein that various statistical metrics such as, but not limited to, means, standard deviations, or $3\sigma$ (3s) values of the preliminary device overlay measurements and the self-calibrating assist overlay measurements should match when the overlay recipe is performing within selected tolerances.

In another embodiment, the step 310 includes adjusting the preliminary device overlay measurements to compensate for differences between the one or more statistical metrics. For example, the step 310 may include performing a transformation on the preliminary device overlay measurements such that they conform to the one or more statistical metrics of the self-calibrated assist overlay measurements.

Figure 5:
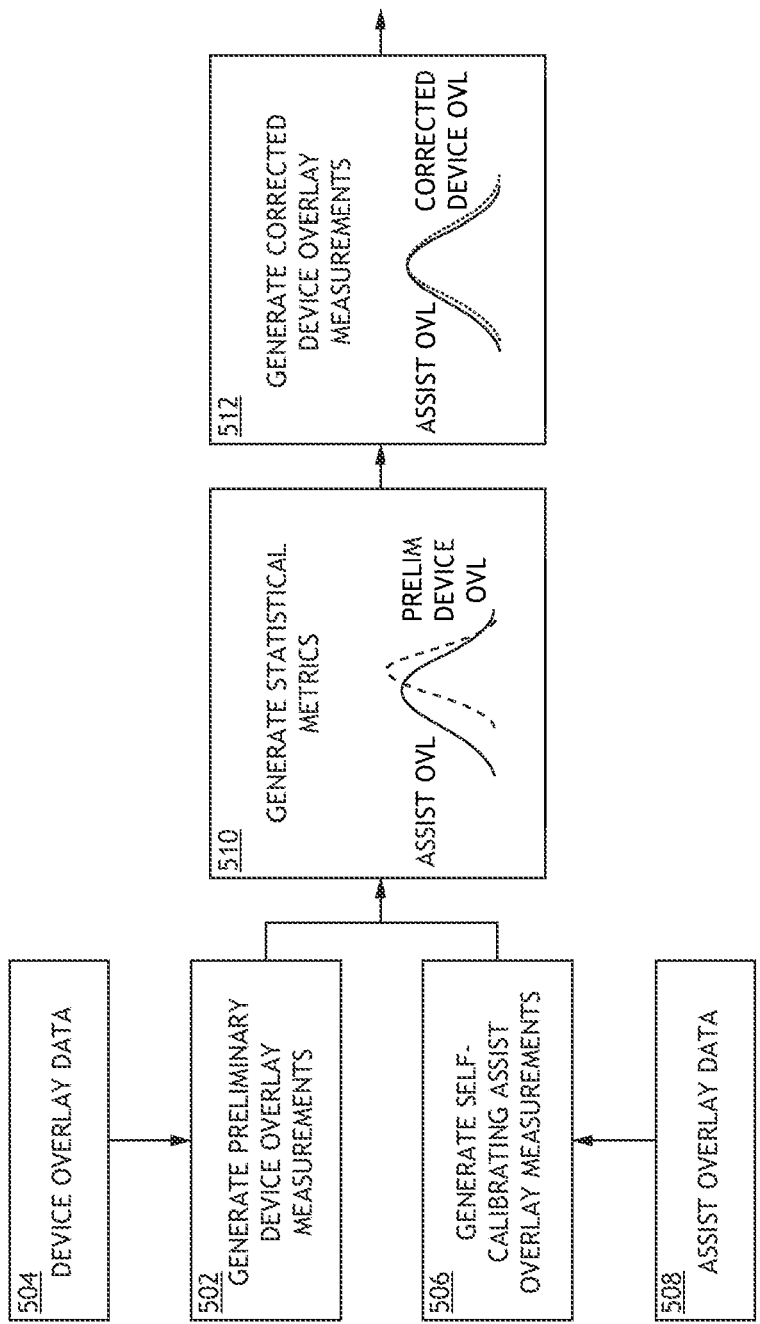
FIG. 5 is a block diagram illustrating a flow for adjusting the preliminary device overlay measurements to compensate for differences between the one or more statistical metrics, in accordance with one or more embodiments of the present disclosure.

FIG. 5 is a block diagram illustrating a flow for adjusting the preliminary device overlay measurements to compensate for differences between the one or more statistical metrics, in accordance with one or more embodiments of the present disclosure.

In one embodiment, preliminary device overlay measurements are generated (box 502) using an existing overlay recipe based on device overlay data (box 504) of device targets on a sample 104 (e.g., corresponding to the step 302 and the step 304 of the method 300).

In another embodiment, self-calibrating assist overlay measurements are generated (box 506) based on assist overlay data (box 508) of sets of assist targets on the sample 104 (e.g., corresponding to the step 306 and the step 308 of the method 300).

In another embodiment, one or more statistical metrics associated with the preliminary device overlay measurements and the self-calibrating assist overlay measurements are generated and compared (box 510). For example, the box 510 illustrates statistical distributions of the self-calibrating assist overlay measurements (ASSIST OVL) and the preliminary device overlay measurements (PRELIM DEVICE OVL).

In another embodiment, the preliminary device overlay measurements are adjusted (box 512) to generate corrected device overlay measurements (e.g., corresponding to the step 310 of the method 300). For example, statistical transformations are applied to the preliminary device overlay measurements to provide that selected statistical metrics match within selected tolerances. Corrected device overlay measurements may then be provided as an output (e.g., to a fabrication host, or the like). Further, correctables for one or more process tools may be generated based on the corrected device overlay measurements.

In another embodiment, the method 300 includes monitoring the performance of the overlay recipe or various process parameters over time. For example, the method 300 may include generating one or more quality metrics associated with the performance of the overlay recipe. In one instance, a quality metric is based on a difference between a statistical metric (e.g., mean, standard deviation, or the like) of the preliminary device overlay measurements and the self-calibrating assist overlay measurement data.

In another embodiment, the method 300 includes retraining the overlay recipe. The overlay recipe may be retrained using any suitable source of training data including, but not limited to the corrected overlay measurements (e.g., generated in step 310), previous training data, new training data, or a combination thereof.

Once retrained, the overlay recipe may be applied in a variety of contexts. For example, the method 300 may include generating updated corrected overlay measurements by applying the retrained overlay recipe to the preliminary device overlay measurements (e.g., generated in step 304).

By way of another example, the retrained overlay data may be used in subsequent runs associated with additional layers on the same sample and/or additional samples.

Various operational flows may be implemented to retrain the overlay recipe which may be initiated based on any selected condition or trigger.

In one embodiment, the overlay recipe may be retrained when a quality metric (e.g., associated with differences between statistical metrics of the preliminary device overlay measurements and the self-calibrating assist overlay measurements) exceeds a selected threshold. In this way, the use of the assist targets as disclosed herein may facilitate in-line recipe retraining as necessary in response to drifts of the performance of the overlay recipe.

Figure 6:
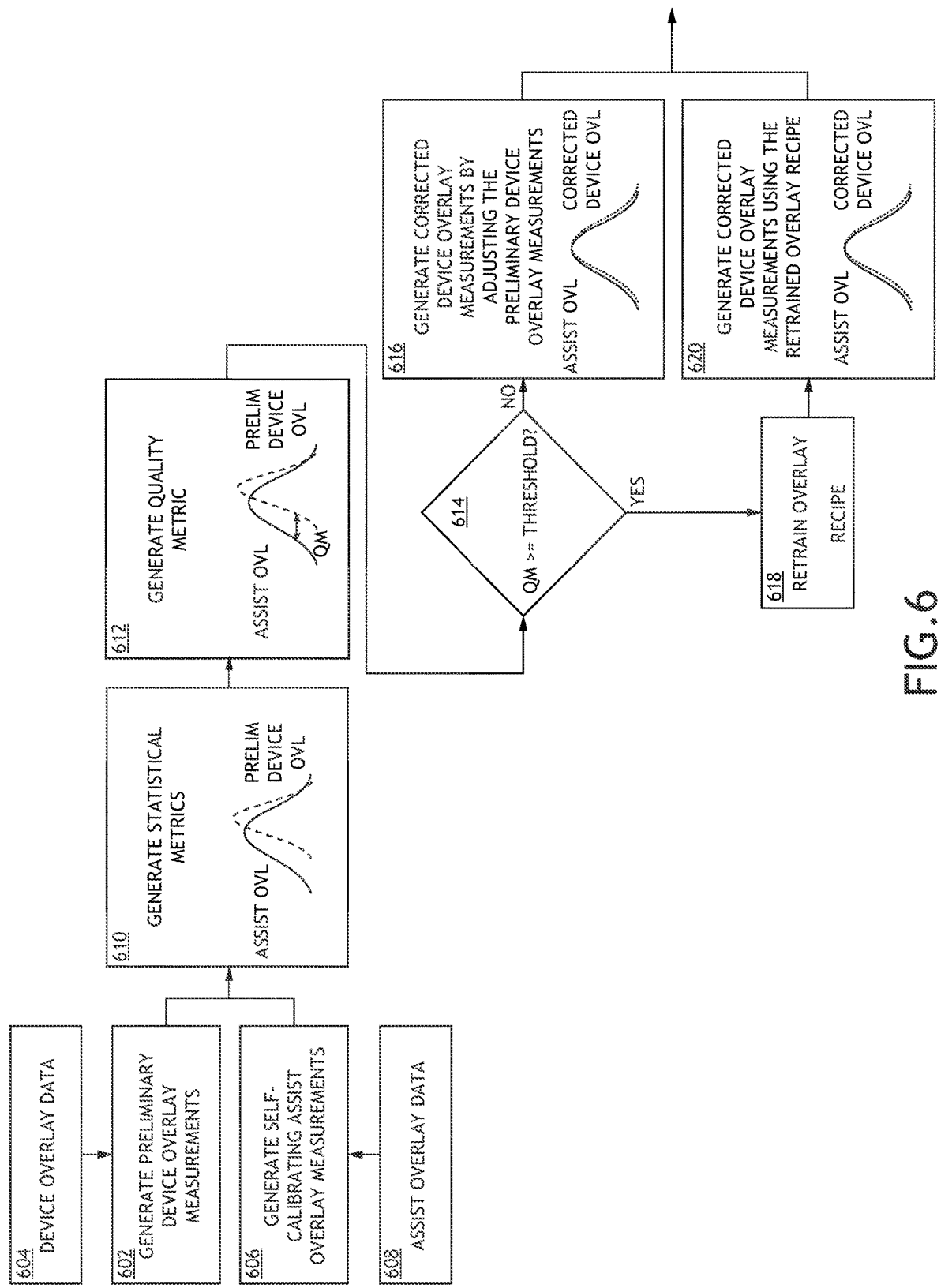
FIG. 6 is a block diagram illustrating a flow for adjusting the preliminary device overlay measurements to compensate for differences between the one or more statistical metrics, in accordance with one or more embodiments of the present disclosure.

FIG. 6 is a block diagram illustrating a flow for adjusting the preliminary device overlay measurements to compensate for differences between the one or more statistical metrics, in accordance with one or more embodiments of the present disclosure.

In one embodiment, preliminary device overlay measurements are generated (box 602) using an existing overlay recipe based on device overlay data (box 604) of device targets on a sample 104 (e.g., corresponding to the step 302 and the step 304 of the method 300).

In another embodiment, self-calibrating assist overlay measurements are generated (box 606) based on assist overlay data (box 608) of sets of assist targets on the sample 104 (e.g., corresponding to the step 306 and the step 308 of the method 300).

In another embodiment, one or more statistical metrics associated with the preliminary device overlay measurements and the self-calibrating assist overlay measurements are generated and compared (box 610). For example, the box 610 illustrates statistical distributions of the self-calibrating assist overlay measurements (ASSIST OVL) and the preliminary device overlay measurements (PRELIM DEVICE OVL).

In another embodiment, a quality metric (QM) is generated (box 612). For example, the quality metric may provide an indication or may otherwise represent differences between statistical metrics of the preliminary device overlay measurements and the self-calibrating assist overlay measurements.

In another embodiment, the quality metric is evaluated (box 614) to determine whether the quality metric exceeds a selected threshold. For example, exceeding the selected threshold may indicate that the overlay recipe or other process parameter is outside operational tolerances. If the quality metric is below the selected threshold, the preliminary overlay device measurements may be adjusted (box 616) (e.g., corresponding to the step 310 of the method 300). For example, statistical transformations are applied to the preliminary device overlay measurements to provide that selected statistical metrics match within selected tolerances. Corrected device overlay measurements may then be provided as an output (e.g., to a fabrication host, or the like). In the case that the quality metric equals or exceeds the selected threshold, the overlay recipe may be retrained (box 618). Further, the overlay recipe may be retrained using any suitable data including, but not limited to, the device overlay data, the self-calibrating assist overlay measurements, stored training data, new training data, or the like. Once retrained, the retrained (e.g., updated) overlay recipe may be used to generate the corrected device overlay measurements (e.g., based on the device overlay data (box 620)).

In another embodiment, the overlay recipe may be retrained asynchronously. For example, the method 300 may utilize two versions of an overlay recipe: a run-time version and a secondary version. In this way, the secondary version may be asynchronously trained or updated based on any available data and then be used to refresh the run-time version upon a trigger condition (e.g., when the quality metric is poor).

As an illustration, various datasets associated with the method 300 such as, but not limited to, the device overlay data, the preliminary device overlay measurements, the assist overlay data, and/or the self-calibrating assist overlay measurements may be stored (e.g., on a memory device 132 including a data server as described with respect to the overlay metrology system 100) for subsequent retrieval. The data server may additionally include training data for the overlay recipe. The secondary overlay recipe may then be asynchronously retrained based on any available data (e.g., data stored on the data server, additional training data, or the like) at any selected interval such as, but not limited to, after a selected periodic or non-periodic time interval or after any number of measurements on any number of samples.

The method 300 may then include updating or refreshing the run-time overlay recipe upon any selected trigger condition. For example, the run-time overlay recipe may be updated as necessary when a quality metric exceeds a selected threshold (e.g., indicating a poor quality). By way of another example, the run-time overlay recipe may be updated at selected periodic or non-periodic intervals.

Figure 7:
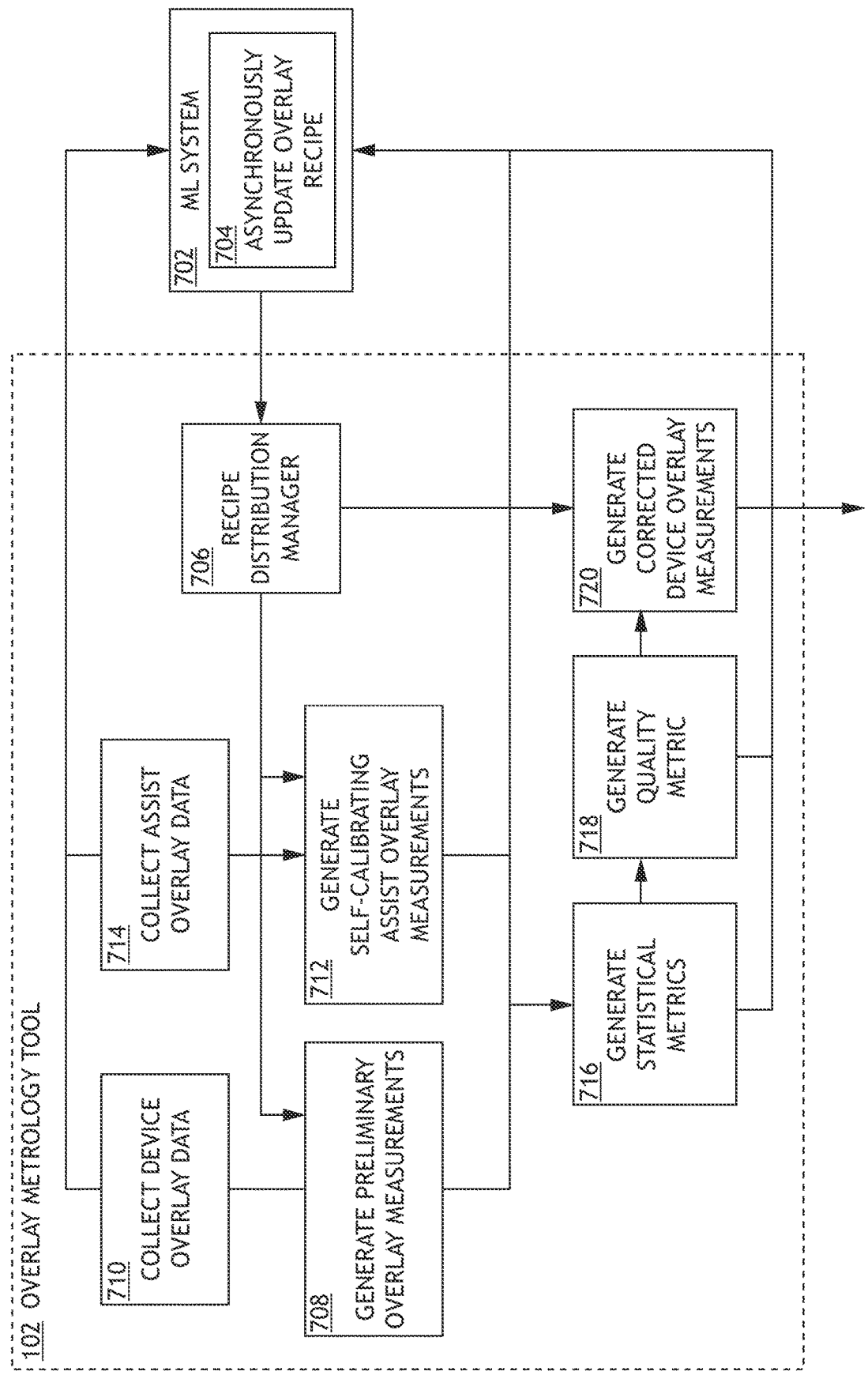
FIG. 7 is a block diagram illustrating a flow for asynchronous recipe retraining in accordance with one or more embodiments of the present disclosure.

FIG. 7 is a block diagram illustrating a flow for asynchronous recipe retraining in accordance with one or more embodiments of the present disclosure.

In one embodiment, a machine-learning (ML) system 702 may asynchronously retrain an overlay recipe (block 704) based on any available data (e.g., device overlay data, preliminary device overlay measurements, assist overlay data, self-calibrating assist overlay measurements, statistical metrics, quality metrics, corrected device overlay measurements, or the like (e.g., as described with respect to the method 300, FIG. 5, and/or FIG. 6). For example, the ML system 702 may update the overlay recipe at selected intervals (e.g., every minute, every hour, or the like). The ML system 702 may then provide an updated (e.g., refreshed) overlay recipe to a recipe distribution manager 706 upon a trigger condition (e.g., a poor quality as determined by a quality metric, or the like) for further use.

For example, FIG. 7 depicts the generation of preliminary device overlay measurements (box 708) using an existing overlay recipe from the recipe distribution manager 706 based on device overlay data (box 710) of device targets on a sample 104 (e.g., corresponding to the step 302 and the step 304 of the method 300). Further, self-calibrating assist overlay measurements are generated (box 712) based on assist overlay data (box 714) of sets of assist targets on the sample 104 (e.g., corresponding to the step 306 and the step 308 of the method 300). Any of this data may then be provided to the ML system 702 for asynchronous recipe retraining.

FIG. 7 further illustrates the generation of one or more statistical metrics associated with the preliminary device overlay measurements and the self-calibrating assist overlay measurements (box 716) followed by the generation of a quality metric (box 718). Any of this data may also be provided to the ML system 702 for asynchronous recipe retraining.

Corrected device overlay measurements may then be generated (box 720) in a variety of ways. For example, if the quality metric is acceptable (e.g., below a selected threshold), the corrected device overlay measurements may be generated based on adjustments to match the statistical metrics of preliminary overlay measurements to the self-calibrating assist overlay measurements (e.g., as described with respect to FIG. 5). By way of another example, if the quality metric is not acceptable (e.g., above the selected threshold), the corrected device overlay measurements may be generated using an updated overlay recipe from the recipe distribution manager 706 that includes the results of asynchronous updates from the ML system 702. This updated recipe may then be used for the generation of preliminary overlay measurements (e.g., box 708o) in subsequent runs.

Further, the various steps in FIG. 7 (and the method 300 more generally) may be carried out by any components. For example, FIG. 7 illustrates a configuration in which the ML system 702 is provided as a server in communication with an overlay metrology tool 102 including the recipe distribution manager 706. In this configuration, various data is streamed to the ML system 702 for asynchronous recipe generation, which is provided back to the recipe distribution manager 706.

However, it is to be understood that the configuration in FIG. 7 is provided solely for illustrative purposes and should not be interpreted as limiting. As described previously herein, the controller 128 may generally be configured as a single controller or multiple controllers and may further be housed in a single housing or multiple housings. In this way, the controller 128 may be provided as a separate component of the overlay metrology system 100 or various portions of the controller 128 may be distributed throughout various components of the overlay metrology system 100. Further, any of the various steps described with respect to the method 300 or any of FIGS. 5-7 may be implemented on any of the various components of the overlay metrology system 100.

Referring again generally to FIG. 3, it is further contemplated herein that the assist targets as disclosed herein may be used to improve tool matching performance and total measurement uncertainty. For example, overlay data (e.g., device overlay data and/or assist overlay data) may be collected using more than one overlay metrology tool 102 or set of measurement conditions for an overlay metrology tool 102 and self-calibrated assist overlay data may be generated for each overlay metrology tool 102 or set of measurement conditions. This self-calibrated assist overlay data may be generated for each overlay metrology tool 102 or a set of measurement conditions may then be used to monitor or evaluate the performance of each overlay metrology tool 102 or configuration. Further, overlay metrology tool 102 or the set of measurement conditions may be updated as required to maintain a desired level of performance.

In another embodiment, the method 300 includes utilizing measurements of features associated with ACI and/or ADI steps to measure and/or monitor one or more process parameters. For example, self-calibrated assist overlay measurements associated with assist targets having features associated with ACI and/or ADI steps may enable the calculation of ADI measurements for the calculation of etch bias, monitoring in-die overlay quality generally, monitoring a nonzero overlay (NZO) signature, or the like. In some instances, an interpolation function is generated to be applied to self-calibrating assist overlay measurements based on ACI inspection (e.g., measurements on assist targets including ACI features) to generate ADI inspection data.

Referring again generally to the method 300, a sample 104 may generally include any number of device targets or sets of assist targets. However, it may be desirable to limit the number of assist targets on the sample to conserve space and/or increase throughput. In one embodiment, a sample 104 includes multiple fields associated with exposures by a lithography tool (e.g., a scanner or a stepper), and further includes one set of assist targets associated with each desired measurement direction for each field and any desired number of device targets per field. As described previously herein, the assist targets may be located at any suitable location on the sample 104 including, but not limited to scribe lines between dies.

In some embodiments, the assist targets in a set of assist targets are fabricated proximate to each other to reduce, eliminate, or otherwise mitigate systematic errors associated with differences in positions between targets. Further, the assist targets in a set of assist targets may be fabricated in any suitable pattern. For example, in the case where a set of assist targets includes a single pair of assist targets, the associated assist targets may be fabricated in a row with any orientation. By way of another example, in the case where a set of assist targets includes two or more pairs of assist targets, the associated assist targets may be fabricated in any selected row, array, or 2D pattern. Further, the assist targets in a pair of assist targets need not be adjacent.

Figure 8:
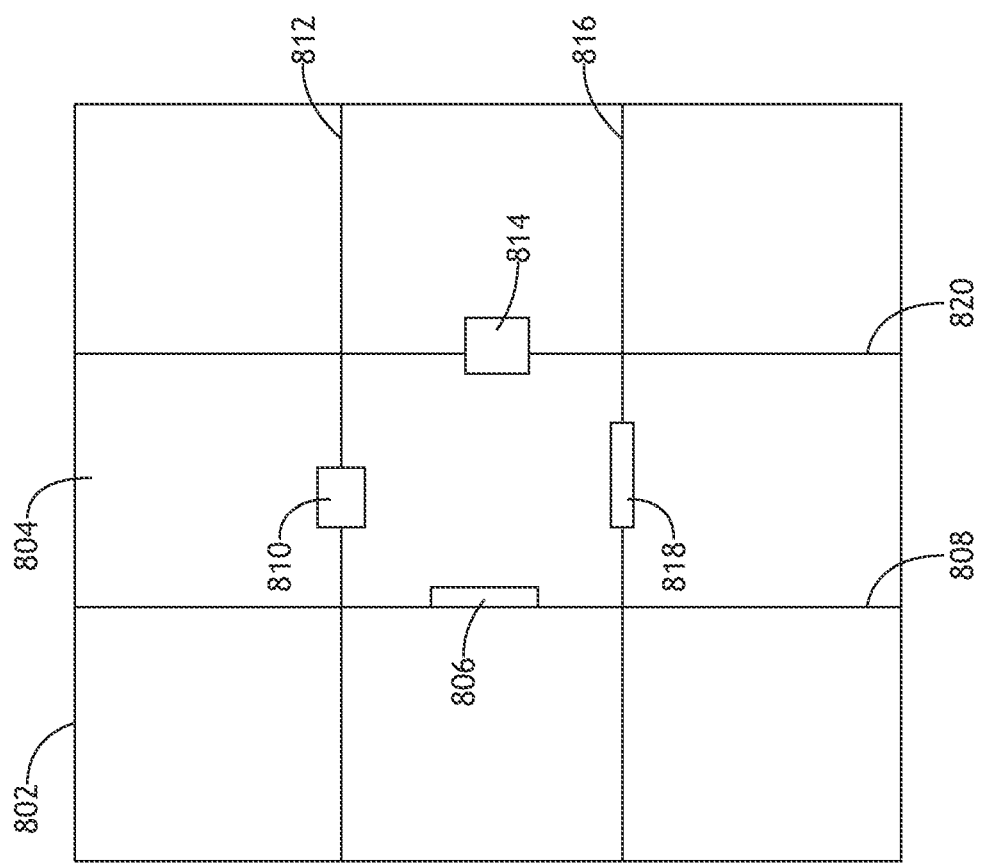
FIG. 8 is a top view of a field on a sample illustrating various non-limiting placement positions for assist targets, in accordance with one or more embodiments of the present disclosure.

FIG. 8 is a top view of a field 802 on a sample 104 illustrating various non-limiting placement positions for assist targets, in accordance with one or more embodiments of the present disclosure. FIG. 7 illustrates an array of nine dies 804 in the field 802 and a series of scribe lines between the dies 804. Further, FIG. 7 illustrates a first potential placement location 806 for a row of assist targets along a vertical scribe line 808, a second potential placement location 810 for a row of assist targets along a horizontal scribe line 812, a third potential placement location 814 for an array of assist targets along a vertical scribe line 816, and a fourth potential placement location 818 for a row of assist targets along a horizontal scribe line 820. Additionally, the assist targets may extend into any of the dies 804 or may be formed fully within any of the scribe lines.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random-access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the noninclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A self-calibrating overlay metrology system comprising:
    a controller including one or more processors configured to execute program instructions causing the one or more processors to:
        receive device overlay data for a plurality of device targets on a sample from an overlay metrology tool;
        determine preliminary device overlay measurements for the plurality of device targets including device-scale features using an overlay recipe with the device overlay data as inputs;
        receive assist overlay data for one or more assist targets on the sample including device-scale features from the overlay metrology tool, wherein at least one of the one or more assist targets has a programmed overlay offset of a selected value along a particular measurement direction;
        determine self-calibrating assist overlay measurements for the one or more assist targets based on the assist overlay data, wherein the self-calibrating assist overlay measurements are linearly proportional to overlay on the sample; and
        generate corrected overlay measurements for the plurality of device targets by adjusting the preliminary device overlay measurements based on the self-calibrating assist overlay measurements.

2. The self-calibrating overlay metrology system of claim 1, wherein the sample includes a plurality of fields associated with lithographic exposures across the sample, wherein the sample includes at least one device target and at least one of the one or more assist targets per field.

3. The self-calibrating overlay metrology system of claim 1, wherein the plurality of device targets comprise in-die device targets, wherein the preliminary device overlay measurements comprise in-die overlay measurements.

4. The self-calibrating overlay metrology system of claim 3, wherein at least one of the one or more assist targets is located in a scribe line.

5. The self-calibrating overlay metrology system of claim 1, wherein the overlay metrology tool comprises:
    at least one of an ellipsometer, a reflectometer, or a scatterometer.

6. The self-calibrating overlay metrology system of claim 1, wherein the overlay metrology tool comprises:
    at least one of an x-ray metrology tool or an electron-beam metrology tool.

7. The self-calibrating overlay metrology system of claim 1, wherein determining the self-calibrating assist overlay measurements for a particular one of the one or more assist targets based on the assist overlay data comprises:
    generating one or more asymmetric signals based on the assist overlay data associated with the particular one of the one or more assist targets, wherein the one or more asymmetric signals provide an asymmetric variation to overlay deviations on the sample from a nominal overlay condition; and
    determining the self-calibrating assist overlay measurements for the particular one of the one or more assist targets.

8. The self-calibrating overlay metrology system of claim 1, wherein the one or more processors are further configured to execute program instructions causing the one or more processors to:
    determine a quality metric of the preliminary device overlay measurements based on the preliminary device overlay measurements and the self-calibrating assist overlay measurements.

9. The self-calibrating overlay metrology system of claim 1, wherein generating corrected overlay measurements for the plurality of device targets by adjusting the preliminary device overlay measurements based on the self-calibrating assist overlay measurements comprises:
    comparing the preliminary device overlay measurements with the self-calibrating assist overlay measurements based on one or more statistical metrics; and
    correcting the preliminary device overlay measurements to compensate for differences between the one or more statistical metrics.

10. The self-calibrating overlay metrology system of claim 1, wherein generating corrected overlay measurements for the plurality of device targets by adjusting the preliminary device overlay measurements based on the self-calibrating assist overlay measurements comprises:
    comparing the preliminary device overlay measurements with the self-calibrating assist overlay measurements based on one or more statistical metrics;
    generating a quality metric associated with the one or more statistical metrics;
    correcting the preliminary device overlay measurements to compensate for differences between the one or more statistical metrics if the quality metric is below a selected threshold; and
    retraining the overlay recipe using the self-calibrating assist overlay measurements and generating the corrected overlay measurements based on the overlay recipe after retraining if the quality metric is equal to or above a selected threshold.

11. The self-calibrating overlay metrology system of claim 1, wherein the one or more processors are further configured to execute program instructions causing the one or more processors to:
    store the device overlay data, the preliminary device overlay measurements, the assist overlay data, and the self-calibrating assist overlay measurements for the sample and one or more additional samples;
    asynchronously retrain the overlay recipe based on the stored device overlay data, the preliminary device overlay measurements, the assist overlay data, and the self-calibrating assist overlay measurements to generate a refreshed overlay recipe; and
    update the overlay recipe with the refreshed overlay recipe when a quality metric associated with differences between the preliminary device overlay measurements and the self-calibrating assist overlay measurements on a current sample is below a selected threshold.

12. The self-calibrating overlay metrology system of claim 11, wherein storing the device overlay data, the preliminary device overlay measurements, the assist overlay data, and the self-calibrating assist overlay measurements for the sample and one or more additional samples comprises:
    store the device overlay data, the preliminary device overlay measurements, the assist overlay data, and the self-calibrating assist overlay measurements for the sample and one or more additional samples on a data server.

13. The self-calibrating overlay metrology system of claim 12, wherein data server further includes stored training data associated with the overlay recipe, wherein the overlay recipe is further asynchronously retrained with the training data.

14. The self-calibrating overlay metrology system of claim 12, wherein at least one of the one or more assist targets includes features associated with at least one of an after-development step or an after-cleaning step.

15. The self-calibrating overlay metrology system of claim 1, wherein at least one of the one or more assist targets includes features associated with a current process step and features associated with one or more previous process steps.

16. The self-calibrating overlay metrology system of claim 1, wherein at least one of the one or more assist targets includes features associated with at least one of an after-development step or an after-cleaning step.

17. The self-calibrating overlay metrology system of claim 1, wherein the one or more processors are further configured to execute program instructions causing the one or more processors to:
    store the device overlay data, the preliminary device overlay measurements, the assist overlay data, and the self-calibrating assist overlay measurements associated with one or more after-development inspection steps and one or more after-cleaning inspection steps;
    generate an interpolating function to be applied to after-cleaning inspection steps to obtain after-development inspection data.

18. The self-calibrating overlay metrology system of claim 1, wherein the preliminary device overlay measurements and the self-calibrating assist overlay measurements are associated with a first spectral range, wherein a sample tilt is determined from a second spectral range different than the first spectral range.

19. The self-calibrating overlay metrology system of claim 1, wherein the one or more processors are further configured to execute program instructions causing the one or more processors to:
   generate correctables for a lithography tool based on the corrected overlay measurements; and
   direct the lithography tool to adjust one or more parameters based on the correctables.

20. The self-calibrating overlay metrology system of claim 1, wherein the one or more processors are further configured to execute program instructions causing the one or more processors to:
   store at least one of the device overlay data, the preliminary device overlay measurements, the assist overlay data, the self-calibrating assist overlay measurements, the corrected overlay measurements, or the quality metrics on a data server.

21. A self-calibrating overlay metrology system comprising:
   two or more overlay metrology tools;
   a controller including one or more processors configured to execute program instructions causing the one or more processors to:
      receive device overlay data for a plurality of device targets on a sample from the two or more overlay metrology tools;
      determine preliminary device overlay measurements for the plurality of device targets including device-scale features using an overlay recipe with the device overlay data as inputs;
      receive assist overlay data for one or more assist targets on the sample including device-scale features from the overlay metrology tool, wherein at least one of the one or more assist targets has a programmed overlay offset of a selected value along a particular measurement direction;
      determine self-calibrating assist overlay measurements for the one or more assist targets based on the assist overlay data, wherein the self-calibrating assist overlay measurements are linearly proportional to overlay on the sample;
      generate quality metrics for the two or more overlay metrology tools based on differences between the preliminary device overlay measurements and the self-calibrating assist overlay measurements from the two or more overlay metrology tools;
      select one of the two or more overlay metrology tools based on the quality metrics for the two or more overlay metrology tools; and
      generate corrected overlay measurements associated with the selected one of the two or more overlay metrology tools for the plurality of device targets by adjusting the preliminary device overlay measurements based on the self-calibrating assist overlay measurements.

22. The self-calibrating overlay metrology system of claim 21, wherein the two or more overlay metrology tools comprises:
   at least two of an ellipsometer, a reflectometer, a scatterometer, an x-ray metrology tool, or an electron-beam metrology tool.

23. The self-calibrating overlay metrology system of claim 21, wherein the sample includes a plurality of fields associated with lithographic exposures across the sample, wherein the sample includes at least one device target and at least one of the one or more assist targets per field.

24. The self-calibrating overlay metrology system of claim 21, wherein the plurality of device targets comprise in-die device targets, wherein the preliminary device overlay measurements comprise in-die overlay measurements.

25. The self-calibrating overlay metrology system of claim 24, wherein at least one of the one or more assist targets is located in a scribe line.

26. The self-calibrating overlay metrology system of claim 21, wherein determining the self-calibrating assist overlay measurements for a particular one of the one or more assist targets based on the assist overlay data from a particular overlay metrology tool of the two or more overlay metrology tools comprises:
   generating one or more asymmetric signals based on the assist overlay data associated with the particular one of the one or more assist targets, wherein the one or more asymmetric signals provide an asymmetric variation to overlay deviations on the sample from a nominal overlay condition; and
   determining the self-calibrating assist overlay measurements for the particular one of the one or more assist targets based on a linear combination of the two asymmetric signals.

27. The self-calibrating overlay metrology system of claim 21, wherein generating corrected overlay measurements associated with the selected one of the two or more overlay metrology tools for the plurality of device targets by adjusting the preliminary device overlay measurements based on the self-calibrating assist overlay measurements comprises:
   comparing the preliminary device overlay measurements with the self-calibrating assist overlay measurements from the selected one of the two or more overlay metrology tools based on one or more statistical metrics; and
   correcting the preliminary device overlay measurements to compensate for differences between the one or more statistical metrics.

28. The self-calibrating overlay metrology system of claim 21, wherein generating corrected overlay measurements associated with the selected one of the two or more overlay metrology tools for the plurality of device targets by adjusting the preliminary device overlay measurements based on the self-calibrating assist overlay measurements comprises:
   comparing the preliminary device overlay measurements with the self-calibrating assist overlay measurements from the selected one of the two or more overlay metrology tools based on one or more statistical metrics;
   generating an additional quality metric associated with the one or more statistical metrics;
   correcting the preliminary device overlay measurements to compensate for differences between the one or more statistical metrics if the quality metric is below a selected threshold; and
   retraining the overlay recipe using the self-calibrating assist overlay measurements and generating the corrected overlay measurements based on the overlay recipe after retraining if the quality metric is equal to or above a selected threshold.

29. The self-calibrating overlay metrology system of claim 21, wherein the one or more processors are further configured to execute program instructions causing the one or more processors to:
   store the device overlay data, the preliminary device overlay measurements, the assist overlay data, and the self-calibrating assist overlay measurements for the sample and one or more additional samples;

asynchronously retrain the overlay recipe based on the stored device overlay data, the preliminary device overlay measurements, the assist overlay data, and the self-calibrating assist overlay measurements to generate a refreshed overlay recipe; and update the overlay recipe with the refreshed overlay recipe when a quality metric associated with differences between the preliminary device overlay measurements and the self-calibrating assist overlay measurements on a current sample is below a selected threshold.

30. The self-calibrating overlay metrology system of claim 29, wherein storing the device overlay data, the preliminary device overlay measurements, the assist overlay data, and the self-calibrating assist overlay measurements for the sample and one or more additional samples comprises:

store the device overlay data, the preliminary device overlay measurements, the assist overlay data, and the self-calibrating assist overlay measurements for the sample and one or more additional samples on a data server.

31. The self-calibrating overlay metrology system of claim 30, wherein data server further includes stored training data associated with the overlay recipe, wherein the overlay recipe is further asynchronously retrained with the training data.

32. The self-calibrating overlay metrology system of claim 30, wherein at least one of the one or more assist targets includes features associated with at least one of an after-development step or an after-cleaning step.

33. The self-calibrating overlay metrology system of claim 21, wherein the one or more processors are further configured to execute program instructions causing the one or more processors to:

store at least one of the device overlay data, the preliminary device overlay measurements, the assist overlay data, the self-calibrating assist overlay measurements, the corrected overlay measurements, or the quality metrics on a data server.

34. A method for self-calibrating overlay metrology comprising:

generating device overlay data for a plurality of device targets on a sample with one or more overlay metrology tools;

determining preliminary device overlay measurements for the plurality of device targets including device-scale features using an overlay recipe with the device overlay data as inputs;

generating assist overlay data for one or more assist targets on the sample including the device-scale features using the at least one overlay metrology tool, wherein at least one of the one or more assist targets has a programmed overlay offset of a selected value along a particular measurement direction;

determining self-calibrating assist overlay measurements for the set of assist targets based on the assist overlay data; and generating corrected overlay measurements associated with each of the one or more overlay metrology tools for the plurality of device targets by adjusting the preliminary device overlay measurements based on the self-calibrating assist overlay measurements.

* * * * *